United States Patent
Calderbank et al.

(10) Patent No.: US 9,632,866 B2
(45) Date of Patent: Apr. 25, 2017

(54) SYSTEMS FOR AND METHODS OF EXTENDING LIFETIME OF NON-VOLATILE MEMORY

(71) Applicant: DUKE UNIVERSITY, Durham, NC (US)

(72) Inventors: Arthur Robert Calderbank, Durham, NC (US); Adam N. Jacobvitz, Durham, NC (US); Daniel J. Sorin, Durham, NC (US)

(73) Assignee: Duke University, Durham, NC (US)

( * ) Notice: Subject to any disclaimer, the term of this patent is extended or adjusted under 35 U.S.C. 154(b) by 98 days.

(21) Appl. No.: 14/430,158

(22) PCT Filed: Sep. 28, 2012

(86) PCT No.: PCT/US2012/057844
§ 371 (c)(1),
(2) Date: Mar. 20, 2015

(87) PCT Pub. No.: WO2014/051611
PCT Pub. Date: Apr. 3, 2014

(65) Prior Publication Data
US 2015/0248325 A1    Sep. 3, 2015

(51) Int. Cl.
*G06F 11/10* (2006.01)
*G06F 11/00* (2006.01)
(Continued)

(52) U.S. Cl.
CPC ...... *G06F 11/1016* (2013.01); *G06F 11/1048* (2013.01); *G06F 11/1072* (2013.01);
(Continued)

(58) Field of Classification Search
None
See application file for complete search history.

(56) References Cited

U.S. PATENT DOCUMENTS

| 8,176,234 | B2 * | 5/2012 | Franceschini ....... G06F 12/0246 365/185.33 |
| 8,578,359 | B2 * | 11/2013 | Meller ................... G06F 8/665 717/122 |

(Continued)

OTHER PUBLICATIONS

L. A. Lastras-Montano, M. Franceschini, T. Mittelholzer, J. Karidis and M. Wegman, "On the lifetime of multilevel memories," 2009 IEEE International Symposium on Information Theory, Seoul, 2009, pp. 1224-1228. doi: 10.1109/ISIT.2009.5205976.*

(Continued)

*Primary Examiner* — Justin R Knapp
(74) *Attorney, Agent, or Firm* — Talem IP Law, LLP

(57) ABSTRACT

Systems and Methods are provided for increasing the number of writes to a page of non-volatile memory before the page must be erased. According to an embodiment, instead of writing a dataword directly to memory, a codeword is written to the memory location. The codeword is selected to minimize overwrite (e.g., bit-flipping) and to maximize the spread of wear across memory cells. In accordance with various embodiments of the invention, coset coding is integrated with error correction encoding; and once the previous state of a page is determined, a coset representative is selected on the basis of maximizing the number of writes to the page before erasing.

33 Claims, 14 Drawing Sheets

(51) Int. Cl.
  *G11C 29/52* (2006.01)
  *G11C 16/10* (2006.01)
  *G11C 7/10* (2006.01)
  *G11C 11/56* (2006.01)
  *G11C 13/00* (2006.01)
  *G11C 16/06* (2006.01)
  *G11C 16/34* (2006.01)

(52) U.S. Cl.
  CPC ........ *G11C 7/1006* (2013.01); *G11C 11/5628* (2013.01); *G11C 13/0004* (2013.01); *G11C 13/0069* (2013.01); *G11C 16/06* (2013.01); *G11C 16/10* (2013.01); *G11C 16/349* (2013.01); *G11C 29/52* (2013.01)

(56) References Cited

U.S. PATENT DOCUMENTS

| | | | |
|---|---|---|---|
| 8,595,573 B2* | 11/2013 | Shalvi | G06F 11/1044 714/42 |
| 8,631,309 B2* | 1/2014 | Graumann | H03M 13/1148 714/764 |
| 2009/0132621 A1 | 5/2009 | Jensen et al. | |
| 2010/0169743 A1 | 7/2010 | Vogan et al. | |
| 2011/0138104 A1* | 6/2011 | Franceschini | G06F 12/0246 711/103 |
| 2011/0138106 A1 | 6/2011 | Prabhakaran et al. | |
| 2011/0246703 A1* | 10/2011 | Franceschini | G11C 7/1006 711/103 |
| 2011/0252186 A1 | 10/2011 | Dinker | |
| 2012/0054415 A1 | 3/2012 | Danilak | |

OTHER PUBLICATIONS

International Search Report and Written Opinion issued in International Patent Application No. PCT/US2012/057844, mailed Jun. 24, 2013; 12 pages.

Ryan, M.S. et al.; "The Viterbi Algorithm"; University of Warwick, Department of Computer Science Research Reports, No. 238; Feb. 12, 1993; 17 pages.

Goodson, Garth et al.; "Design Tradeoffs in a Flash Translation Layer"; HPCA West 2010—Bangalore, India; 7 pages.

Forney, Jr., G. David; "Coset Codes—Part I: Introduction and Geometrical Classification"; IEEE Transactions on Information Theory, vol. 34, No. 5; Sep. 1988; 29 pages.

* cited by examiner

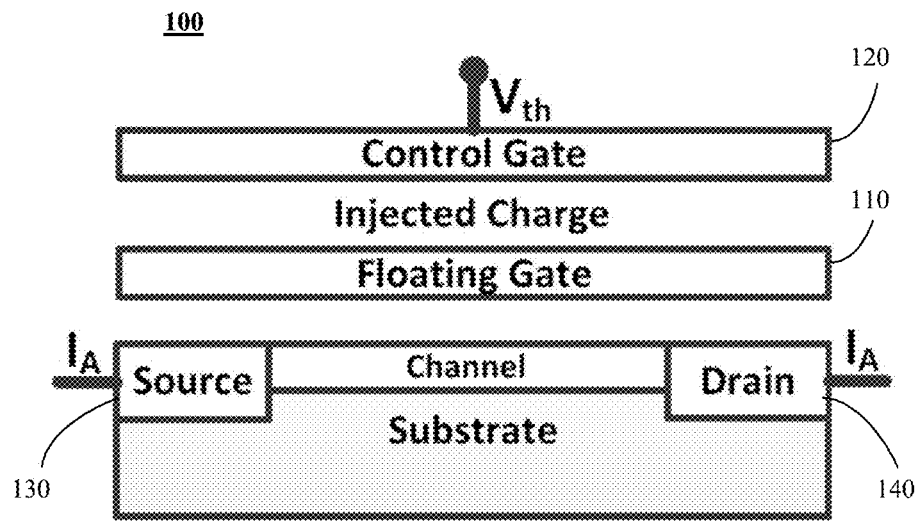
FIG. 1 – PRIOR ART
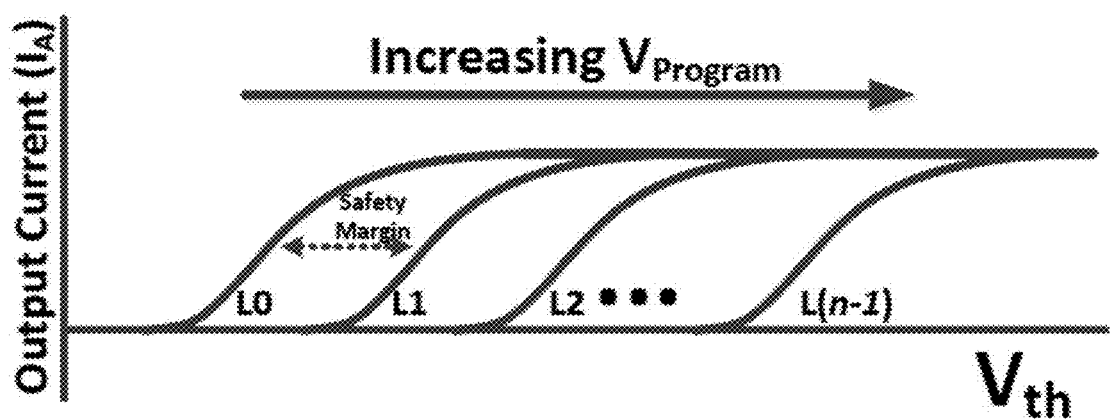
FIG. 2 – PRIOR ART

SYSTEMS FOR AND METHODS OF EXTENDING LIFETIME OF NON-VOLATILE MEMORY

CROSS-REFERENCE TO RELATED APPLICATION

This application is the U.S. national stage application of International Application Serial No. PCT/US2012/057844, filed Sep. 28, 2012, which is hereby incorporated by reference in its entirety, including all figures, tables and drawings.

BACKGROUND OF THE INVENTION

Solid state disks (SSD) have been gaining ground for replacing hard disk drives (HDDs) as the storage medium of choice for both consumer and enterprise applications. Instead of the moving parts found in HDDs, SSDs use a Flash memory (e.g., NAND, NOR) or a dynamic random access memory (DRAM) to store data. Flash SSDs are popular SSDs because of their speed, reliability, and availability. For example, since Flash is a nonvolatile memory, data can be retained even when power failure occurs.

However, one of Flash SSD's issues is "wear out". Wear out refers to the fact that an SSD can only support a limited number of writes (and erasures) before cells fail. This shortcoming can be magnified by patterns of writing data that concentrate writes on a small number of cells in a given device.

In addition, because Flash is a semiconductor-based technology, it can suffer from manufacturing defects and transient errors. Transient errors include errors due to alpha particle strikes and neutron particle strikes, as well as "retention errors" where charge slowly leaks out of the Flash cell causing it to change value. Error correction codes (ECCs) are usually employed to inhibit Flash from degrading and adversely affecting SSD reliability due to manufacturing defects and transient errors. However, as the Flash wears out, ECC becomes more difficult to perform and a reduction in performance may ensue.

Accordingly, extending the operating life of Flash memory is an area of ongoing research in order for SSDs to continue to make inroads in replacing HDDs.

BRIEF SUMMARY

Techniques and systems for extending the lifetime of non-volatile memory, including Flash memory, are provided. In accordance with embodiments of the invention, the lifetime of Flash memory is increased by reducing the frequency with which a given page of memory is erased.

According to one aspect, the reduction in the frequency in which a given page of memory is erased is accomplished by increasing the number of writes to a page that are possible before erasure is necessary.

According to another aspect, by providing positive lifetime extension, embodiments of the invention make performing in-place updates feasible, reducing the need to migrate data to a new block when writing to memory. In addition, overwriting of unused pages can be performed without erasing a block.

According to another aspect, the writing to a given region of memory (e.g., a page) is applicable to single-level sells (SLCs) and multi-level cells (MLCs).

According to various embodiments of the invention, redundancy is introduced into the write process to decrease the number of memory cells that are impacted by a given write, and to even out the impact of writing across an entire page of memory.

In accordance with embodiments of the invention, data is written to memory with minimized overwriting while spreading the writing (e.g., the write load) across cells of a page (also referred to as wearleveling). Optimally, the writing is performed evenly over the page. Overwriting can be minimized by using a previous state of the memory to facilitate in the selection of the codeword written to memory and/or location in memory to which the codeword is written. Thus, a writing of 0s to all cells of a page or a writing of 1s to all cells of a page (e.g., for an operation of the erase function in a manner that removes charge from the region between the floating gate and control gates) in order to write the data to memory is minimized.

The methods and techniques of various embodiments of the invention can be carried out in any system in which memory is used that could benefit from extending the lifetime of the memory. The systems include, but are not limited to, computing devices including mobile computing devices, smartphones, general purpose computers, specific purpose computers and sensors (e.g., instrumentation). Embodiments can be implemented for embedded memory (e.g., embedded cache), as well as memory at a chip level, card level (e.g., stick, card), drive level (e.g., SSD), and rack mount level. In one embodiment, a memory and a memory manager is provided in which the memory manager is configured to encode write data to the memory.

A Flash SSD of an embodiment of the invention can include a controller configured to receive data from a host device such as a computer or the like and encode the data to write the data to memory. According to one embodiment, data is written to memory using a coset of a redundant code. In another embodiment, data is written to memory using a coset of a convolutional code. In yet another embodiment, data is written to memory using a coset of a block code.

To integrate the lifetime extension methods of embodiments of the invention with error correction, the coset representative written to memory can be selected from an error correcting code. For example, using a single error correction of a Hamming code, the Viterbi algorithm can select a representative using Hamming weight.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 1 shows an abstracted representation of a Floating Gate MOSFET used in Flash Memory.

FIG. 2 shows a plot of output current ($I_d$) as a function of voltage level $L_i$, i=0, 1, . . . , n−1 for an n-level cell.

FIG. 9A shows first state convergence; and FIG. 9B shows % of full lifetime gain.

FIG. 12A shows a first embodiment using the Viterbi edge metric incorporating PCPWC (11 writes before erase); FIG. 12B shows a second embodiment using the Viterbi edge metric forcing interpolation of saturated cell entries (16-17 writes before erase); and FIG. 12C shows the Viterbi edge metric combining the first and second embodiments (18 writes before erase).

FIG. 13A shows Legend and Code Used; FIG. 13B shows Encoding, No Prior Writes; FIG. 13C shows Encoding with Prior Writes; and FIG. 13D shows Encoding, Unwritable Cell.

DETAILED DISCLOSURE

Figure 3:
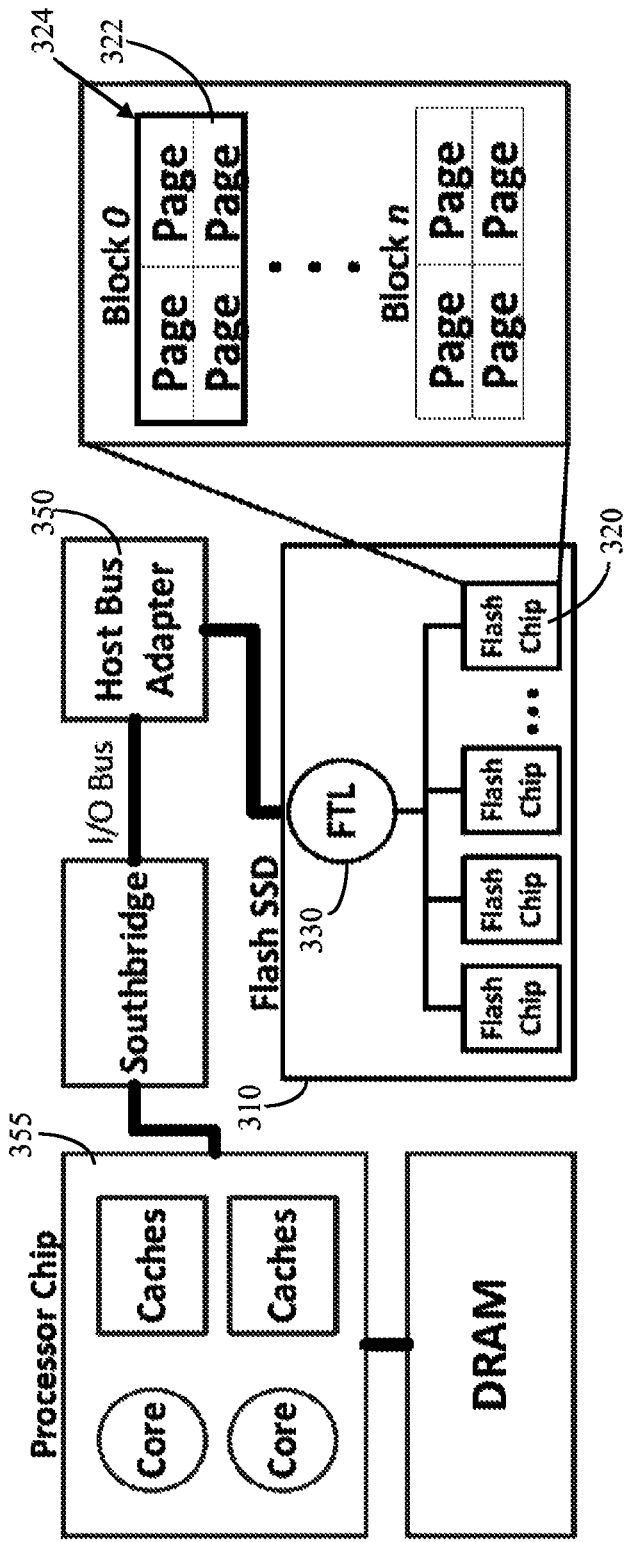
FIG. 3 shows high level architecture of an environment in which embodiments of the invention may be carried out.

Techniques and systems for extending the lifetime of non-volatile memory, including Flash memory, are provided. In accordance with embodiments of the invention, methods of managing memory are provided in which the lifetime of memory, particularly Flash memory, is increased by increasing the number of writes to a page that are possible before erasure is necessary and spreading the write load across cells of the page; and systems are provided in which the subject methods can be carried out.

In accordance with embodiments of the invention, data is written to memory with minimized overwriting while spreading the writing (e.g., the write load) across cells of a page (also referred to as wearleveling).

As used herein, "overwriting" refers to the replacing of old data with new data at a cell or bit-level. It is the release or addition of charge (or other memory storage mechanism) to a same cell (or memory element). Accordingly, the phrase "minimizing overwrite/overwriting" refers to the minimizing of the number of bit positions that must be modified to represent a new data string when storing the new data to memory.

Optimally, the writing is performed evenly over the page. Overwriting can be minimized by using a previous state of the memory to facilitate in the selection of the codeword written to memory and/or location in memory to which the codeword is written. Thus, a writing of 0s to all cells of a page or a writing of 1s to all cells of a page (e.g., for an operation of the erase function in a manner that removes charge from the region between the floating gate and control gates) in order to write the data to memory is minimized. Flash memory devices, including Flash SSDs, generally utilize a metal oxide semiconductor field effect transistor (MOSFET)-based structure. For example, a Flash MOSFET may resemble a traditional planar MOSFET, but includes two gates: a floating gate and a control gate. Referring to FIG. 1, which provides an abstracted structure of a Flash transistor 100, when charge is present between the floating gate 110 and the control gate 120, a voltage above a threshold $V_{th}$ applied to the control gate 120 will turn ON the transistor 100. If no charge is present between the two gates, the same voltage applied to the control gate 120 will not turn on the transistor 100. When the transistor 100 is ON, current $I_A$ travels from source 130 to drain 140 and the charge in the transistor can be read from a bit line connected to the drain 140.

In a Flash SSD, the Flash MOSFETs are arranged in cells and connected either in a NOR-based configuration or a NAND-based configuration. Often, each cell contains one Flash transistor. Because the example implementations are described with respect to NAND Flash SSDs, "Flash" and "NAND Flash" when referring to a SSD will be used interchangeably hereafter to refer to the NAND type Flash SSD. However, it should be understood that the invention is not limited to NAND Flash and embodiments of the invention are applicable to NOR Flash (and other Flash variants), as well as Phase Change Memory (PCM), Spin Transfer Torque (STT), Memristors, and memories not listed but in which induced wear is asymmetric (e.g., where erasing not writing causes wear).

SSDs store state in Flash memory through two operations: PROGRAM and ERASE. Programming is the act of injecting charge between a cell's control gate 120 and floating gate 110 through either Hot-Electron Injection (HEI) or Fowler-Nordheim (FN) tunneling. HEI uses strong lateral and transversal electric fields to quickly inject carriers through the tunnel oxide (usually between the floating gate and the substrate) and into the oxide between the floating gate 110 and the control gate 120 (represented by the gap shown in FIG. 1 indicating injected charge). FN tunneling uses a strong electric field across a thin oxide (e.g., between the floating gate and substrate) to induce quantum tunneling. Erasure of a block of cells requires removing the charge from the gate, typically through FN tunneling.

In Flash memory cells, it is possible to create multiple ON states for the transistor by varying the amount of charge between the floating and control gate. Single-level cells (SLCs) contain two states (e.g., 0, 1). Cells which are programmed to contain more than two states are known as multi-level cells (MLCs) (e.g., 00, 01, 10, 11). FIG. 2 shows how the output current of a MLC depends on the control gate threshold voltage ($V_{th}$) and on the level of charge between the floating and control gates. A safety margin is used to assure that one level is not read as another.

It is customary to fabricate MLCs to store multiple bits in a single Flash cell, but it is not strictly necessary that the number of states be a power of 2. For example, 3, 5, or 7 states may be used. An MLC can be eraselessly reprogrammed through program without erase (PWE), which functions by enabling the MLC's state to be incremented without first requiring an erase by increasing the charge between the floating and control gates. Embodiments of the invention leverage the PWE approach for MLCs to increase the lifetime of NAND Flash memory. Accordingly various embodiments include endurance codes that make use of the PWE write mechanism, enabling the incremental programming of Flash cells without first requiring an erase. Of course embodiments are also applicable to SLCs.

In NAND Flash, multiple cells are controlled by a single select transistor. This grouping of cells provides the Minimum Addressable Unit (MAU) of the NAND Flash SSD and is often referred to as a page. The page is the smallest region of memory that can be Read/Written to at a given time. The size of a page depends on the underlying design for the Flash product. The pages may be grouped into blocks, which may be erased as a single unit.

FIG. 3 illustrates a system model of a Flash SSD 310 in accordance with an embodiment of the invention showing integration of computer processor and Flash SSD in which embodiments of the invention may be carried out. Flash SSDs 310 are composed primarily of two components: the NAND Flash memory chips 320 in which data is stored, and a controller 330 often referred to as a Flash Translation Layer (FTL). A component on the host computer known as the Host Bus Adapter (HBA) 350 uses a protocol (such as small computer system interface (SCSI), Infiniband, Fibre Channel (FC), peripheral component interconnect (PCI)/PCI Express, or serial AT attachment/parallel AT attachment (SATA/PATA) based protocol) to communicate with the SSD 310.

The FTL of the controller 330 translates memory read/write requests from the host processor 355 into the sequence of operations that are necessary to change the state of the Flash memory. The FTL accesses SLC or MLC Flash memory cells of a Flash chip 320 at a granularity of a page 322. Typically, a page 322 is 2 KB, 4 KB, 8 KB and sometimes more. Flash memory is erased at the coarser granularity of a block 324, typically 256 KB or more. The FTL layer provides a logical block interface to the Flash device. Since Flash does not support overwriting flash pages in place, an FTL maps logical block addresses to physical Flash pages (e.g., the grouping of cells for writing) and blocks (e.g., the grouping of pages for erase). Mapping from Flash to logical blocks may be algorithmic or the mapping from Flash to logic blocks may entail mapping information that is stored persistently on the Flash chip and that may be spread across metadata regions of each page.

Embodiments of the invention can be implemented as part of the FTL. According to one embodiment, a controller (or FTL) is provided that writes to the Flash memory using techniques described herein.

It should be understood that the methods and techniques of various embodiments of the invention can be carried out in any system in which memory is used that could benefit from extending the lifetime of the memory. The systems include, but are not limited to, computing devices including mobile computing devices, smartphones, general purpose computers, specific purpose computers and sensors (e.g., instrumentation). Embodiments can be implemented for embedded memory (e.g., embedded cache), as well as memory at a chip level, card level (e.g., stick, card), drive level (e.g., SSD), and rack mount level.

In one embodiment, a memory and a memory manager is provided in which the memory manager is configured to encode write data to the memory.

In accordance with embodiments of the invention, the wear out of Flash cells is delayed by reducing the frequency with which blocks are erased. This improvement is accomplished because erasures stress Flash cells and reducing erasures reduces the stress on the cells. Furthermore, without error correction, a page may fail when a single cell fails within that page. Thus, some level of error correction is used to improve data integrity and minimize effects of cells containing erroneous data.

Therefore, by increasing the number of writes before an erasure is necessary, as well as by writing in an even manner across the page as provided by embodiments of the invention, the wear out of Flash cells can be delayed.

In accordance with embodiments of the invention, a method is provided in which a current memory state is read, a codeword to write to memory is selected according to a metric minimizing overwrite to the current memory state and maximizing spread of wear across memory cells (promoting even distribution), and the codeword is written to memory.

Two metrics used to evaluate the performance of codes used to extend Flash SSD lifetime include lifetime gain and write efficiency.

Lifetime gain measures how many additional writes to a page (the MAU of a Flash SSD, but may reference another unit for other memories) are possible when writing with a code compared to writing without a code. In particular, lifetime gain is the ratio of coded writes to the baseline of uncoded writing to a page. Embodiments of the invention seek to increase the number of times it is possible to write to a page before erasing.

$$\text{Lifetime Gain} \triangleq \left( \frac{\text{\# of Writes w/ Code Before Erase is } Req.}{\text{\# of Writes w/o Code Before Erase is } Req.} - 1 \right) \times 100\%$$

Write efficiency, which can be used to indicate when more writes to a page may be possible, is the ratio of cells written to cells available. Although this is a useful metric, it can be seen that the metric would report 100% write efficiency even if a page was exhausted by writing to every cell.

$$\text{Write Efficiency} \triangleq \left( \frac{\text{\# of Writes to all Cells Before Erase is } Req.}{\text{Max \# of Writes Possible to all Cells}} \right) \leq 1$$

Codes (such as provided in various embodiments of the invention) that are designed to optimize the lifetime gain and write efficiency can be referred to as "endurance codes". Examples of endurance coding for SSDs include Write Once Memory (WOM), Write Asymmetrical Memory (WAM), WOM/WAM floating coding, and WOM/WAM enumerative coding.

Figure 4:
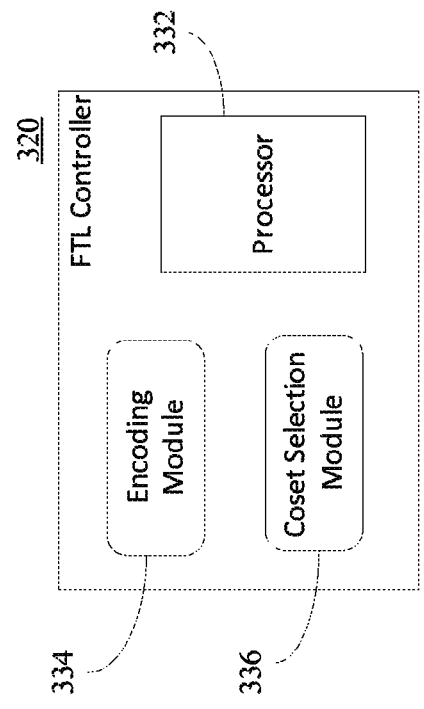
FIG. 4 shows a diagram of a FTL controller of a Flash SSD in accordance with an embodiment of the invention.

According to one embodiment, an integrated coset coding and error correction is used to construct an endurance code for encoding data being written to memory by the FTL of an embodiment of the invention. FIG. 4 shows a block diagram of a FTL controller 320 in accordance with an embodiment of the invention. Referring to FIG. 4, the FTL controller 320 can include a processor 332 configured to carry out the integrated coset coding and error correction through an encoding module 334 and a coset selection module 336. One or more of the modules may be implemented as hardware or software and/or firmware. In certain embodiments, the encoding module 334 may be implemented as an embedded error correction module on the memory chip. The encoding module 334 and coset selection module 336 can also be implemented as part of other systems (in addition to SSDs) that contain memory.

The encoding module 334 can implement a block code or a convolutional code. The encoding module 334 may implement linear or non-linear codes.

A block code, often used as an error correction code (ECC), is an injective mapping that takes an input sequence of bits segmented into message blocks of a fixed length (e.g., a string of length k) and transforms each message block (according to certain rules) into a codeword (or code vector) of length n (where n>k). Each codeword generally has a redundant checking part (of n−k bits), also referred to as a parity part, and a message part (of k bits). The special case where k=n introduces no redundancy into the injective mapping. Certain embodiments contemplate the use of this case. Examples of block codes include Hamming codes, Reed-Muller codes, and Reed-Solomon codes.

A convolutional code, also often used as an ECC, is a binary code and adds redundant bits to a dataword (e.g., an input sequence of bits). A rate-k/n convolutional encoder processes an input sequence of k-bit information symbols through one or more binary shift registers or via one or more matrices. The shift registers may be located as part of the FTL controller (and may be part of or coupled to the processor 332). The convolutional encoder computes each n-bit symbol (n>k) of the output sequence from linear operations on the current input symbol and the contents of the shift register(s) or the matrices.

The ECC codewords obtained by the encoding module 334 of embodiments of the invention may be systematic or non-systematic. A systematic codeword contains the uncoded dataword. In contrast, for a non-systematic codeword, the uncoded dataword is not present in the codeword.

In block codes, the information bits are followed by the parity bits (information is mapped block-wise); however in certain cases a block code has a convolutional representation, such as the Golay code. In convolutional codes, the information bits are spread along the sequence (with code bits interspersed according to some rule); however, in certain cases, convolutional codes can be truncated and treated as a block code. Both block codes and convolutional codes can either be systematic or non-systematic. Embodiments contemplate the use of block codes, convolutional representations of block codes, convolutional codes, truncated convolutional codes, and systematic and non-systematic versions thereof.

The coset selection module 336 finds another codeword in the coset of the ECC code to use in place of the codeword produced by the encoding module 336.

Coset codes primarily involve a binary encoder, block or convolutional, that operates on certain data bits to provide a larger number of coded bits; and an N-dimensional lattice partitioned into subsets corresponding to distinct cosets where the coded bits provided by the binary encoder select a particular coset of the distinct cosets. Where k data bits are operated on by the binary encoder to provide k+r coded bits, n−k uncoded bits can be used to select a particular signal point from the particular coset selected by the k+r coded bits, where n is the number of input data bits (for example to be written to memory), k is a predetermined number of bits (k<n) operated on by the encoder, and r refers to the additional bits resulting from the encoding.

In order to select a particular coset (the representative coset) of the distinct cosets generated using the encoding portion, a cost function is applied to minimize writes to and even out wear of a non-volatile memory. According to an embodiment, a dataword is mapped to a codeword and then a representative from the coset code inside the error correcting code is selected. The coset representative is then used to provide a codeword written to memory.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Figure 5A:
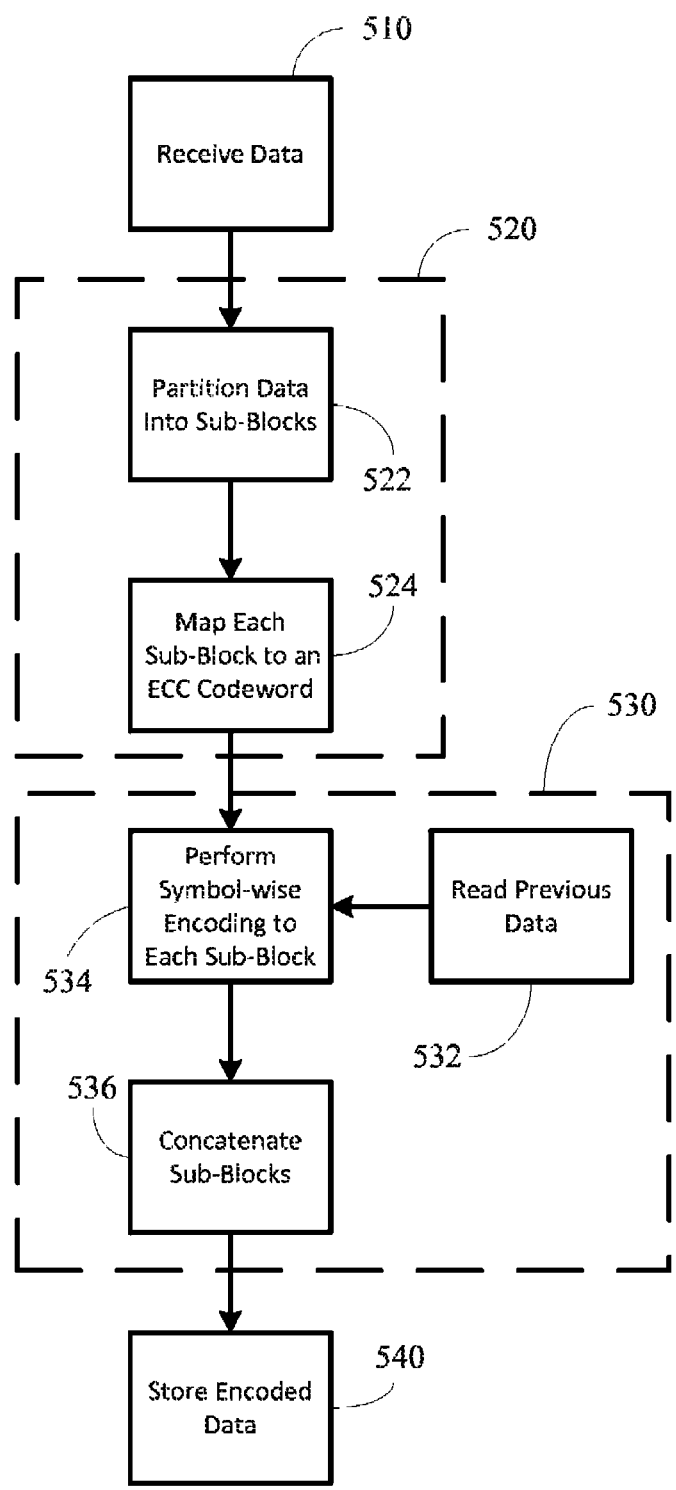
FIG. 5A shows a process flow diagram for writing to memory in accordance with an embodiment of the invention.

FIG. 5A shows a process flow diagram for writing to memory in accordance with an embodiment of the invention. In certain embodiments, a SSD controller (e.g., FTL) can carry out the method illustrated in FIG. 5A to write data to memory as encoded data.

Referring to FIG. 5A, a write request and data to be written to memory can be received by the controller (510). An encoding process is performed to create an ECC codeword (520). The encoding process can utilize block or convolutional coding, including the use of conventional ECC codes. In certain embodiments, the received data can be partitioned into sub-blocks (522) and each sub-block can be mapped to an ECC codeword (524).

Coset encoding can then be performed (530). For example, the previous data state at the write address can be read (532) and used to help select the representative coset during the performing of symbol-wise encoding to each sub-block (534). Where multiple sub-blocks exist, the coset encoded sub-blocks can be concatenated (536) before writing to memory. The Viterbi Algorithm (such as described in the EXAMPLE—Viterbi Algorithm) can be performed to select the representative coset during the encoding step (534). The selected representative coset(s) can be used to encode the data that is written (i.e. stored) to memory (540).

Figure 5B:
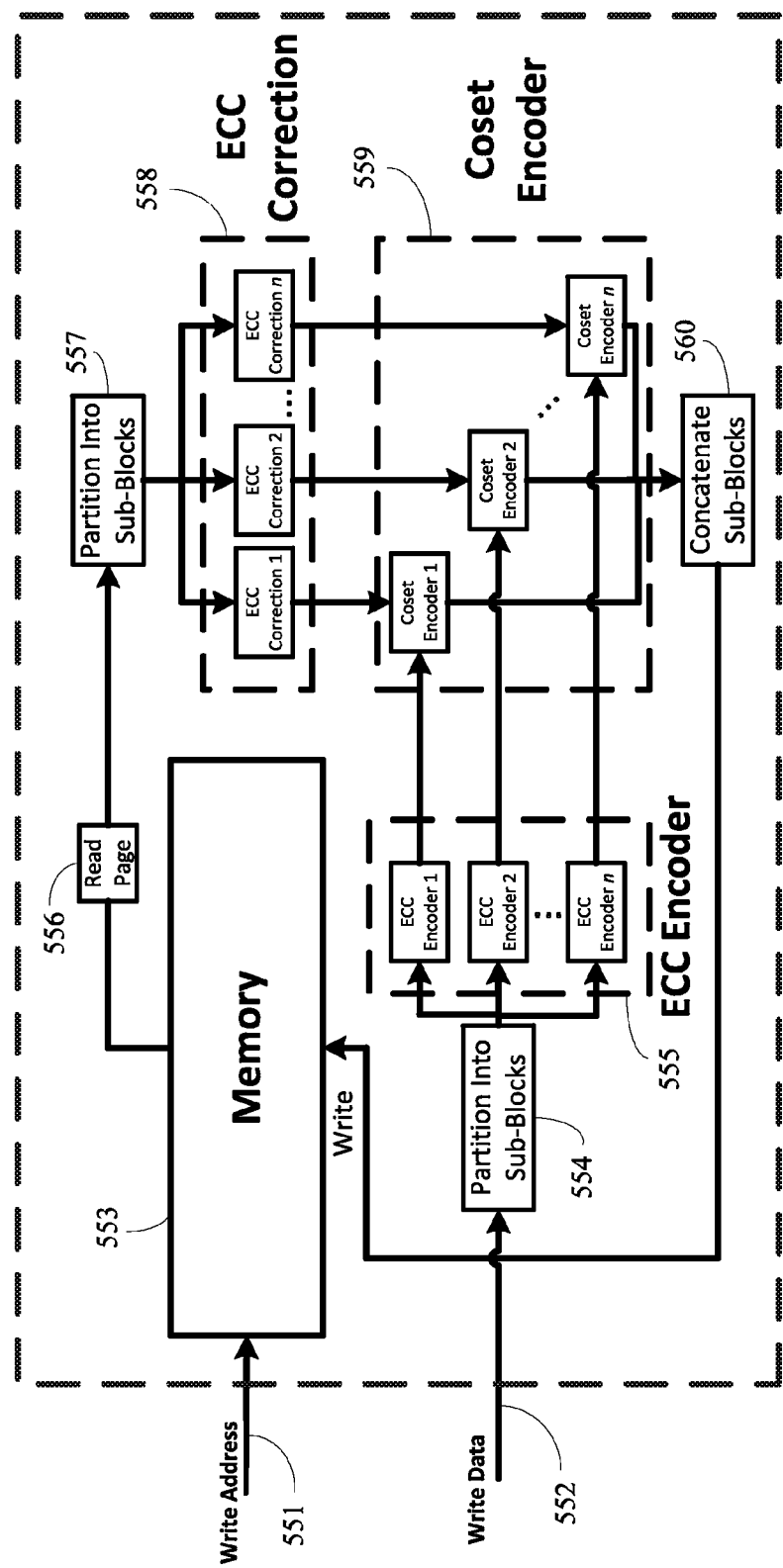
FIG. 5B shows a block diagram of a system performing a write operation in accordance with an embodiment of the invention.

FIG. 5B shows a block diagram of a system performing a write operation in accordance with an embodiment of the invention. Referring to FIG. 5B, a write address 551 and the data to be written (write data) 552 can be received by the system. The write address 551 references a location in memory 553. The memory 553 can be any suitable memory type for a SSD and may be coupled to the memory management system via any suitable interface. For example, the controller portion may be embedded with the memory chip, provided on a board with the memory chip, or connected via a back-plane.

The write data 552 can optionally be partitioned into sub-blocks 554 (such as described with respect to step 522) and each sub-block (or whole block) can be encoded using an ECC encoder 555 (such as described with respect to step 524). The state of the memory 553 at the write address 551 can be read 556 (e.g., step 532) and, optionally, be partitioned into sub-blocks 557 and have error correction 558 performed. The data 556 read from memory and the encoded write data 552 from the ECC encoder 555, can be used as inputs to a coset encoder 559 (such as described with respect to step 534). Where the data has been partitioned into sub-blocks, after performing the coset encoding to each sub-block using the coset encoder 559, the sub-blocks can be concatenated 560 and written to memory 553.

Figure 6A:
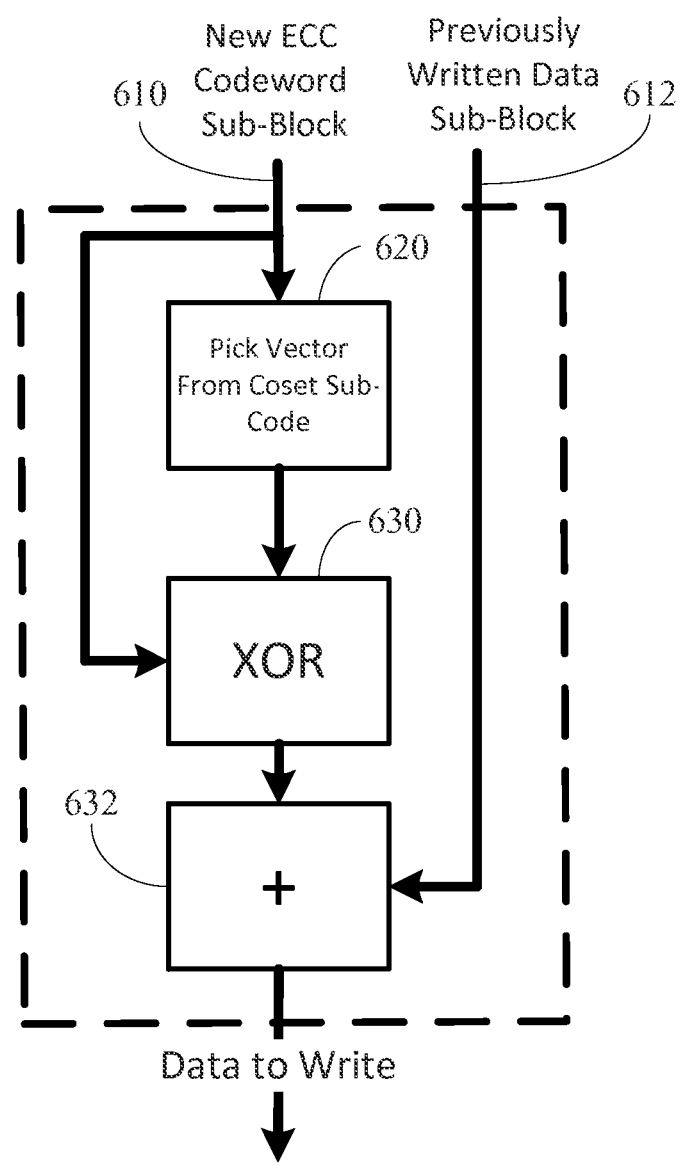
FIG. 6A shows a block diagram of a coset encoder in accordance with an embodiment of the invention.
Figure 6B:
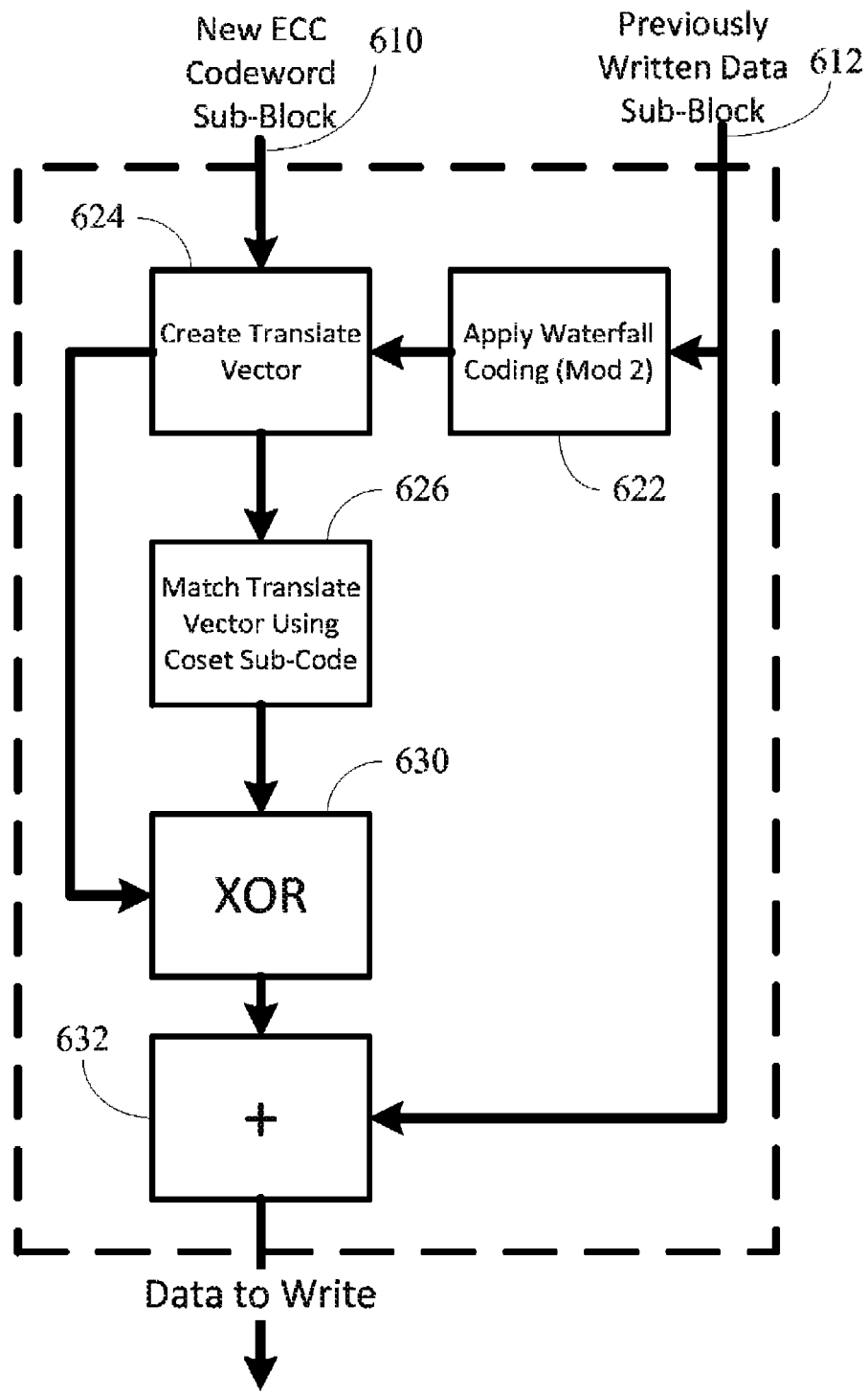
FIG. 6B shows a block diagram of one embodiment of the coset encoder.
Figure 6C:
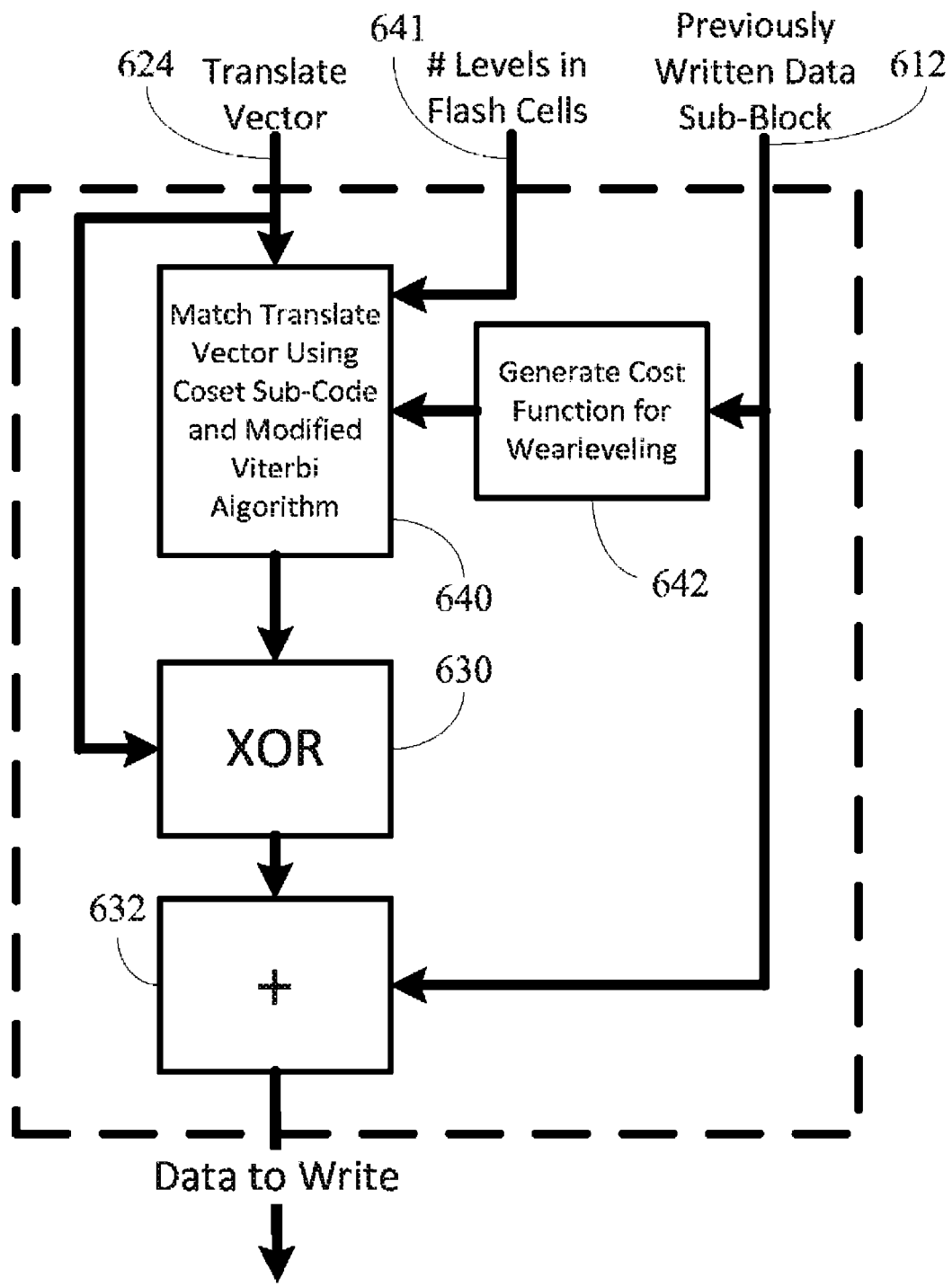
FIG. 6C shows a block diagram of a specific implementation of the coset encoder for an MLC Flash cell according to an embodiment of the invention.

FIG. 6A shows a coset encoder in accordance with an embodiment of the invention; FIG. 6B shows a block diagram of one embodiment of the coset encoder; and FIG. 6C shows a block diagram of a specific implementation of the coset encoder for an MLC Flash cell according to an embodiment of the invention.

Referring to FIG. 6A, the two inputs to the coset encoder include a new ECC codeword 610 (such as from one of the sub-blocks of the ECC encoder 555 of FIG. 5B) and a previously written data sub-block 612 (such as from the read data 556 that may have undergone error correction 558 of FIG. 5B).

In accordance with various embodiments of the invention, a vector is selected from a coset sub-code 620. The coset can be based on the error correction code used to provide the ECC codeword (such as ECC encoder 555). The selected vector 620 is operated with the ECC codeword 610 using an XOR function 630 and compared 632 with the previously written data sub-block to obtain the new bits to be written to memory (and which can be concatenated with the other data sub-blocks 560 as shown in FIG. 5B). Although an XOR function is illustrated and described in embodiments of the invention as providing the Boolean operation, embodiments are not limited thereto.

According to an embodiment, a binary alphabet for coset coding is assumed and waterfall coding (Mod 2) 622 can be applied to the previously written data sub-block 612 and used, along with the new ECC codeword sub-block 610, to create a translate vector 624. The waterfall coding (mod 2) can translate between the binary alphabet of the coset code and the non-binary alphabet of the flash cells. However, it should be understood that a non-binary version of coset coding may be implemented and a different approach for translation used.

In the embodiment shown in FIG. 6B, a vector that is a best match/approximation 626 of the translate vector is obtained using a coset sub-code. The best match/approximation 626 is operated with the translate vector 624 using an XOR function 630 and compared 632 with the previously written data sub-block to obtain the new bits to be written to memory (and which can be concatenated with the other data sub-blocks 560 as shown in FIG. 5B). Although an XOR function is illustrated and described in embodiments of the invention as providing the Boolean operation for the translate vector and the best match/approximation obtained using the coset sub-code, embodiments are not limited thereto.

According to a specific implementation, a modified Viterbi Algorithm is used to obtain a best match/approximation 626 of the translate vector. Referring to FIG. 6C, once the translate vector is obtained, the translate vector 624 is matched using coset sub-code and a modified Viterbi Algorithm 640. The match 640 (also referred to as coset codeword) uses the number of levels in the Flash cells 641 (which may be multiple when using MLC Flash cells) and a cost function for wearleveling 642 according to data from the previously written data sub-block 612. The coset codeword 640 is operated with the translate vector 624 using the XOR function 630 and compared 632 with the previously written data sub-block to obtain the new bits to be written to memory.

Figure 7A:
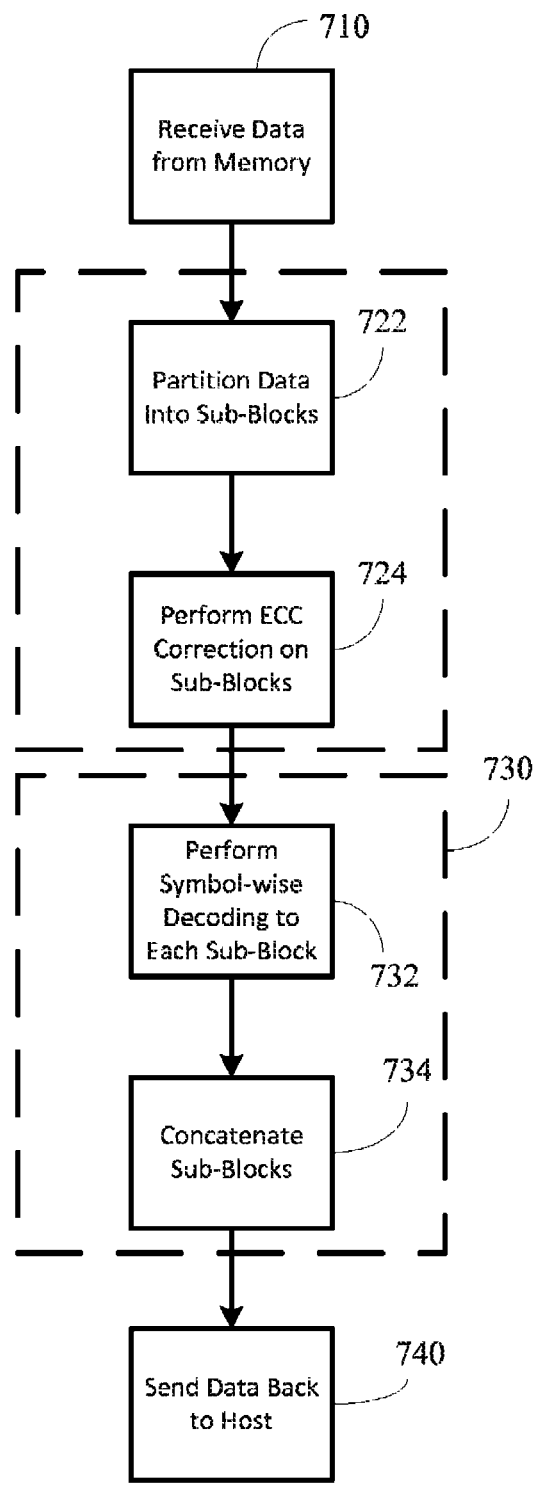
FIG. 7A shows a process flow diagram for reading from memory in accordance with an embodiment of the invention.

FIG. 7A shows a process flow diagram for reading from memory in accordance with an embodiment of the invention. Referring to FIG. 7A, when a read request is received by the memory management system (e.g., FTL controller), the data stored at the memory location indicated by the read request is obtained by the memory management system, which receives the encoded data from memory (710). The encoded data may optionally be partitioned into sub-blocks (722) and undergo ECC correction (724) before being decoded (730). The ECC correction 724 can be any suitable ECC technique of performing error correction. When the encoded data is partitioned into sub-blocks, symbol-wise decoding can be performed to each sub-block (732) and the decoded sub-blocks can be concatenated (734). The decoded data can then be provided to the host (740).

Figure 7B:
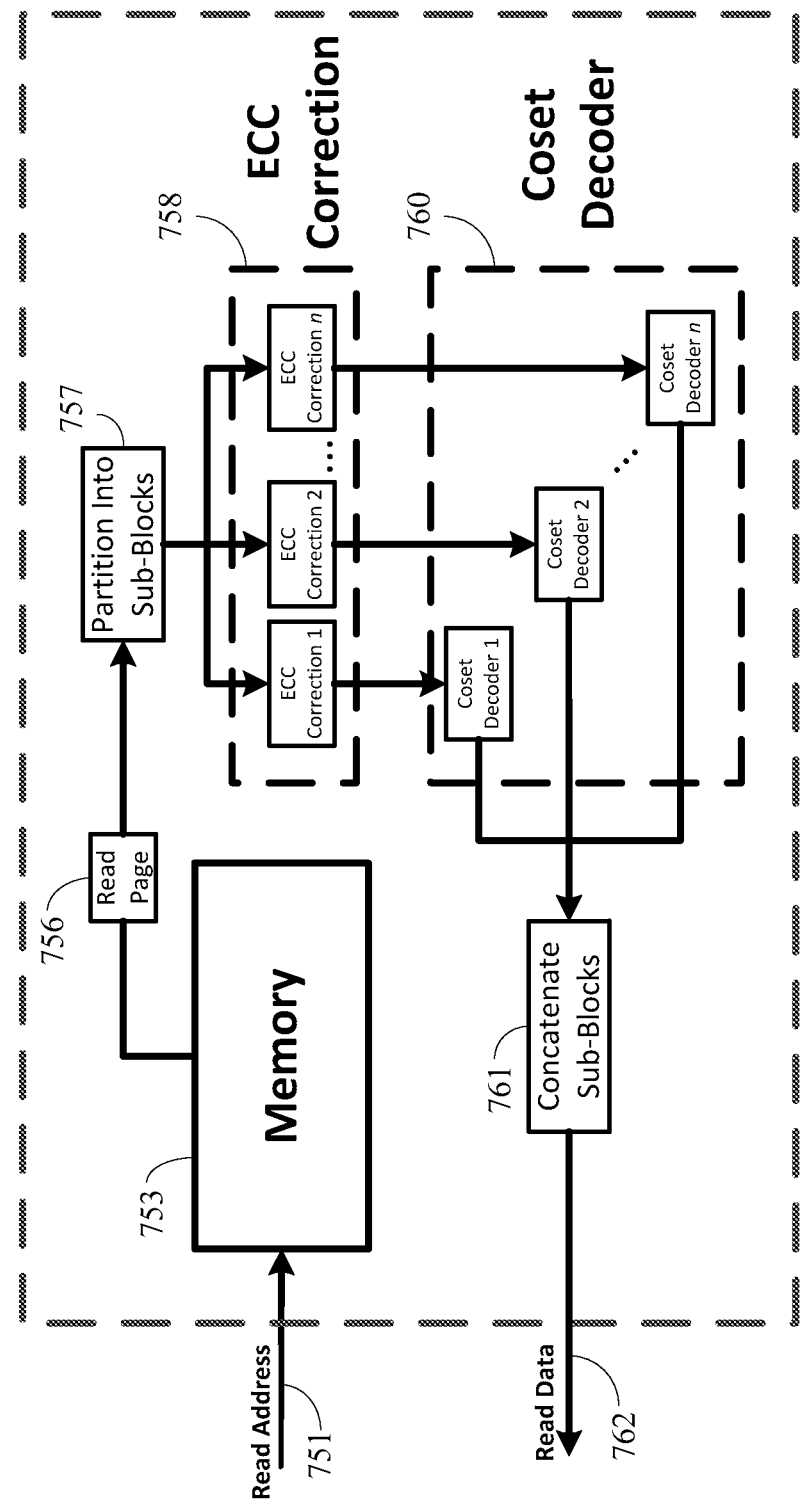
FIG. 7B shows a block diagram of a system performing a read operation in accordance with an embodiment of the invention.

FIG. 7B shows a block diagram of a system performing a read operation in accordance with an embodiment of the invention. Referring to FIG. 7B, a read address 751 can be received by the system. The read address 751 references a location in memory 753. The memory 753 can be any suitable memory type for a SSD and may be coupled to the memory management system via any suitable interface. For example, the controller portion may be embedded with the memory chip, provided on a board with the memory chip, or connected via a back-plane.

The state of the memory 753 at the read address 751 can be read 756 (e.g., step 710) and, optionally, be partitioned into sub-blocks 757 and have error correction 758 performed (such as described with respect to steps 722 and 724). The data read from memory (and having had ECC applied) can be received by a coset decoder 760 and be decoded (such as described with respect to step 732 of FIG. 7A). When the data has been partitioned into sub-blocks, after performing the coset decoding to each sub-block using the coset decoder 760, the sub-blocks can be concatenated 761 and output to host as the read data 762 (step 740 of FIG. 7A).

Example

Hamming Code as ECC Encoder and Repetition Code as Coset Encoder

In one example of encoding data to be written to memory by an FTL of an embodiment of the invention, a single error correcting Hamming code is integrated with coset coding. Of course, embodiments are not limited thereto. For example, an arbitrary linear block code (or a convolutional code as discussed in more detail later) may be used in place of the Hamming code for the ECC code; and repetition Hamming or convolutional code can be used for coset coding.

For the example, an [n,k] binary linear code C is used for error correction and an [n,m] sub-code C' is used for coset coding. Here, input data is encoded as a coset of C' in C and the coset representative is chosen to reduce the number of bits written to memory and to promote wearleveling.

The "area overhead" is the ratio of the number of input data bits (n) to the length of the code (k−m) minus one, that is $$\frac{n}{k-m} - 1.$$

To illustrate the example, the Hamming code ECC encoder is provided as a [8,4] Hamming code C. Here n=8, k=4, m=1 and the area overhead is 8/(4−1)−1=5/3=167%. A generator matrix G representing the [n,k] binary linear code C=[8,4] Hamming code is shown below.

$$G = \begin{bmatrix} 1 & 1 & 1 & 1 & 1 & 1 & 1 & 1 \\ \cdots & \cdots & \cdots & \cdots & \cdots & \cdots & \cdots & \cdots \\ 0 & 1 & 0 & 1 & 0 & 1 & 0 & 1 \\ 0 & 0 & 1 & 1 & 0 & 0 & 1 & 1 \\ 1 & 1 & 1 & 1 & 0 & 0 & 0 & 0 \end{bmatrix} = \begin{bmatrix} B \\ D \end{bmatrix}$$

The first row (m=1) of the generator matrix G generates the repetition code C' and the next three rows (k−m=3) generate distinct coset representatives for C' in C. Three input bits generate a coset of C' in C and the representative is chosen to minimize Hamming weight.

In general a k×n generator matrix G may be selected for C where the first m rows form a matrix B that generates the coset code C' and the remaining k−m rows form a matrix D that generates representatives for $2^{k-m}$ distinct cosets of C' in C.

If d is the dataword, then the coset representative d·D⊕b·B is selected that minimizes the objective function. The input vector b is used to balance lifetime gain and write efficiency.

In one embodiment, an exhaustive search can be performed to select the coset representative.

At small block lengths, the area overhead incurred by error correction and coset coding may be prohibitive. This suggests making block length (of data) and page length (minimum addressable unit of the memory) commensurate. If the dimension of the coset code C' scales linearly with the block length n, then the number of potential coset representatives (forming matrix D) scales exponentially with n and exhaustive search may become infeasible.

Accordingly, various embodiments use the Viterbi algorithm to select the coset representative. The role of the coset code (e.g., formed using the linear code of an error correcting code) is then to provide an ensemble of vectors that can be searched efficiently by the Viterbi algorithm. An example implementation of the Viterbi algorithm in accordance with an embodiment of the invention is provided in the section entitled EXAMPLE—Viterbi Algorithm.

In accordance with embodiments of the invention, an initial coset representative d·D is generated and the Viterbi algorithm is used to find an approximation b·B to d·D. If wearleveling is not included, the approximation found using the Viterbi algorithm would simply reduce to data compression with respect to the Hamming metric.

In accordance with embodiments, the error vector e=c=d·D⊕b·B is then written to memory (e.g., obtained at the XOR operation 630 of FIG. 6A, 6B, or 6C). If the current state of the memory is S, then the translate is S⊕d·D and the translate vector is approximated rather than d·D such that c=[S⊕(d·D)]⊕(b·B)+S.

As explained above, a dataword d is encoded as c=d·D⊕b·B=[d|b]G where G is the generator matrix of the error correcting code C from which a sub-code C' is used for coset coding. Decoding of the encoded dataword c can be accomplished by forming c·G* where G* is the right inverse of G (that is GG*=Ik). One method of calculating G* is to invert the Smith or Hermite Normal Form of G.

Example

Extended Hamming Code as ECC Encoder and Repetition Code as Coset Encoder

As mentioned above, embodiments of the subject coset coding may use block encoding or convolutional encoding.

As an example of using block codes for both error correction and coset coding, an extended Hamming code of length mL, is combined with a coset code formed by concatenating m Repetition codes of length L. The entries of the extended Hamming code (e.g., the output of the extended Hamming encoding) are permuted so that the matrix lattice (the "generator matrix") contains every codeword in the coset code.

A generator matrix for the case m=2, L=8 is shown below; the first two rows form a matrix B that generates the coset code C' and the remaining 9 rows form a matrix D that generates representatives for 512 distinct cosets of C' in C.

$$K = \begin{bmatrix} 0 & 0 & 0 & 0 & 0 & 0 & 0 & 0 \\ 1 & 1 & 1 & 1 & 1 & 1 & 1 & 1 \\ \cdots & \cdots & \cdots & \cdots & \cdots & \cdots & \cdots & \cdots \\ 1 & 1 & 1 & 1 & 1 & 1 & 1 & 1 \\ 0 & 1 & 1 & 1 & 1 & 0 & 1 & 1 \\ 0 & 1 & 1 & 0 & 1 & 0 & 0 & 1 \\ 1 & 0 & 0 & 0 & 0 & 1 & 1 & 1 \\ 0 & 1 & 0 & 1 & 0 & 0 & 1 & 1 \\ 1 & 1 & 1 & 0 & 0 & 0 & 0 & 1 \\ 0 & 1 & 1 & 1 & 0 & 0 & 0 & 1 \\ 1 & 1 & 1 & 0 & 0 & 1 & 0 & 0 \\ 0 & 0 & 0 & 1 & 0 & 0 & 1 & 0 \end{bmatrix}$$

$$L = \begin{bmatrix} 1 & 1 & 1 & 1 & 1 & 1 & 1 & 1 \\ 0 & 0 & 0 & 0 & 0 & 0 & 0 & 0 \\ \cdots & \cdots & \cdots & \cdots & \cdots & \cdots & \cdots & \cdots \\ 1 & 1 & 0 & 1 & 1 & 0 & 0 & 0 \\ 1 & 1 & 1 & 1 & 0 & 0 & 0 & 0 \\ 1 & 0 & 0 & 1 & 0 & 1 & 1 & 0 \\ 1 & 1 & 1 & 0 & 1 & 1 & 1 & 0 \\ 1 & 0 & 1 & 0 & 1 & 1 & 0 & 0 \\ 0 & 0 & 1 & 1 & 1 & 0 & 0 & 1 \\ 0 & 1 & 1 & 1 & 0 & 0 & 0 & 1 \\ 1 & 0 & 0 & 1 & 0 & 0 & 0 & 0 \\ 0 & 0 & 1 & 1 & 0 & 1 & 0 & 1 \end{bmatrix}$$

$$G = [K \; L] = \begin{bmatrix} B \\ D \end{bmatrix}$$

An exhaustive search can be performed or the Viterbi algorithm can be used to find an approximation b·B to d·D to write to memory.

Bit Flip Gain

Bit flip gain refers to reducing the number of bit flips for a given write. For a repetition code $R_L$ of length L, when an input is a random binary vector of length L, a bit flip gain of the repetition code $R_L$ can be defined as:

$$\text{Bit Flip Gain} \triangleq \left( \frac{\text{\# of Bits Flipped Writing a Dataword}}{\text{\# of Bits Flipped Writing a Codeword}} \right).$$

When L is even, the Bit Flip Gain of the repetition code $R_L$ of length L is given by $$\frac{L/2}{\frac{L}{4(2^{L-1})}\left(2^L - \binom{L}{L/2}\right)} \quad (1)$$

and when L is odd, the Bit Flip Gain is given by $$\frac{L/2}{\frac{L}{2^L}\left(2^{L-1} - \binom{L-1}{(L-1)/2}\right)} \quad (2)$$

The bit flip gain can also be expressed as the ratio of L/2 to the expected number of bit flips $E_L$.

Bit Flip Gain—for Cosets Using Block Code

Figure 8:
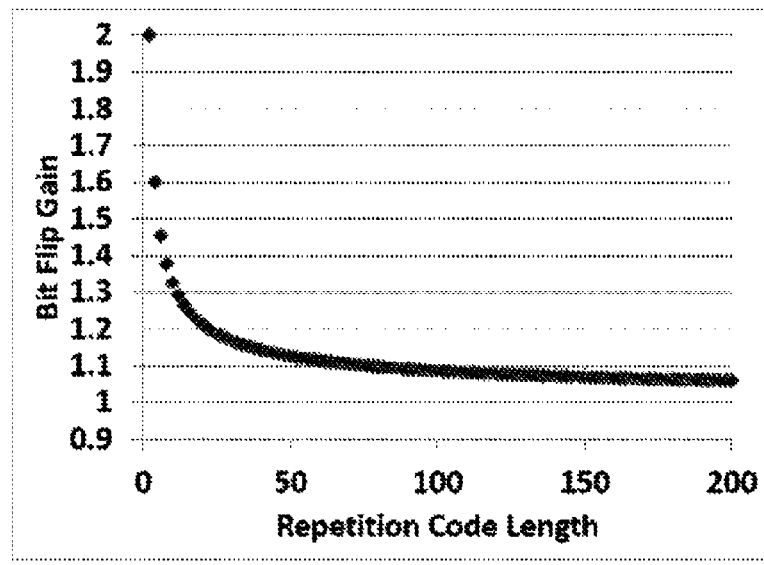
FIG. 8 is a plot of Bit Flip Gain as a function of the repetition code block length L.

FIG. 8 is a plot of Bit Flip Gain as a function of the repetition code block length L for an embodiment incorporating Flip-N-Write, an approach described by S. Cho and H. Lee, "Flip-n-write: a simple deterministic technique to improve pram write performance, energy and endurance," in Proceedings of the 42$^{nd}$ Annual IEEE/ACM International Symposium on Microarchitecture, ser. MICRO 42. New York, N.Y., USA: ACM, 2009, pp. 347-357, which is incorporated herein by reference in its entirety.

The area overhead is L/(L−1). As indicated in FIG. 8, the Bit Flip Gain $$\left(\frac{L/2}{E_L}\right)$$

decreases with the block length L. Accordingly, shorter codes are less efficient but provide larger bit flip gains. This is unsurprising since the most likely input vector weight is L/2, and therefore the longer the input vector the less likely it is that there will be bit flip gains.

For the block code coset example using generator matrix for the case m=2, L=8, the area overhead is 16/9−1=77% and the bit flip gain is 1.38 (calculated using (1) in the section entitled BIT FLIP GAIN because L is even).

The bit flip gains of coset codes C' contained in the extended Hamming code of length mL that are the product of m r-dimensional sub-codes C' of the Hamming code of length L were measured for m=2i. Table II provides a numerical evaluation of bit flip gains provided by coset codes that are m-fold direct products of r-dimensional seeds. Flip-N-Write corresponds to the special case of the Repetition code where r=1.

TABLE II

| dim(C') = r | Block Length L | ECC Block Length mL | Bit Flip Gain | Area Overhead (%) |
|---|---|---|---|---|
| 3 | 32 | 64 | 1.07 | 25.49 |
| 3 | 32 | 128 | 1.14 | 18.52 |
| 3 | 32 | 256 | 1.17 | 14.80 |
| 3 | 32 | 512 | 1.19 | 12.78 |
| 3 | 64 | 128 | 1.09 | 12.28 |
| 3 | 64 | 256 | 1.12 | 8.94 |
| 3 | 64 | 512 | 1.14 | 7.11 |
| 3 | 64 | 1024 | 1.15 | 6.11 |
| 3 | 128 | 256 | 1.08 | 6.22 |
| 3 | 128 | 512 | 1.10 | 4.49 |
| 3 | 128 | 1024 | 1.11 | 3.54 |
| 3 | 128 | 2048 | 1.11 | 3.01 |

TABLE II-continued

| dim(C') = r | Block Length L | ECC Block Length mL | Bit Flip Gain | Area Overhead (%) |
|---|---|---|---|---|
| 4 | 8 | 16 | 0.43 | 433.33 |
| 4 | 8 | 32 | 0.91 | 220 |
| 4 | 8 | 64 | 1.14 | 156 |
| 4 | 8 | 128 | 1.27 | 128.57 |
| 4 | 16 | 32 | 0.99 | 77.78 |
| 4 | 16 | 64 | 1.13 | 56.10 |
| 4 | 16 | 128 | 1.21 | 45.45 |
| 4 | 16 | 256 | 1.26 | 39.89 |

As can be seen by Table II, larger values of r and smaller values of L provide higher Bit Flip Gains at the cost of more significant area overhead.

In a further embodiment, in addition to addressing Bit flip gains to write fewer bits, memory lifetime is extended by distributing writes evenly over the memory cells.

Distribution of writes evenly over memory cells can be referred to as wearleveling. The addition of methods of wearleveling in the selection of coset representatives can further improve lifetime extension.

When wearleveling methods are applied to Flip-N-Write modest lifetime extension is possible. For example, assuming 8-level MLC cells, it was possible to use a Repetition code of length L=8 to write to a 4 KB page 8 times rather than 7. In this example, the write efficiency is relatively high (80% after 7 writes and 92% after 8 writes). It is the combination of small overhead and small bit flip gains that limits performance.

Bit Flip Gain—for Cosets Using Convolutional Code

As described above, embodiments of the invention can utilize convolutional codes as coset codes.

Table III shows bit flip gains associated with coset codes that are rate 1/2 convolutional codes. The outer error correcting code is an extended Hamming code. The generator polynomials are taken from Table 12.1 (c) of S. Lin and D. J. Costello, Jr. Error Control Coding, 2$^{nd}$ ed. Pearson Prentice Hall, 2004. The convolutional codes are allowed to start and terminate at any state.

TABLE III

| Constraint Length | Bit Flip Gain | Area Overhead |
|---|---|---|
| 1 | 1.49 | 100% |
| 2 | 1.79 | 100% |
| 3 | 1.85 | 100% |
| 4 | 1.90 | 100% |
| 5 | 1.94 | 100% |
| 6 | 1.97 | 100% |
| 7 | 2.03 | 100% |
| 8 | 2.04 | 100% |

Table IV shows bit flip gains associated with coset codes that are rate 1/4 convolutional codes. The outer error correcting code is an extended Hamming code. The generator polynomials are taken from Table 12.1 (c) of S. Lin and D. J. Costello, Jr. Error Control Coding, 2$^{nd}$ ed. Pearson Prentice Hall, 2004. The convolutional codes are allowed to start and terminate at any state.

TABLE IV

| Constraint Length | Bit Flip Gain | Area Overhead |
|---|---|---|
| 1 | 1.31 | 33% |
| 2 | 1.40 | 33% |
| 3 | 1.51 | 33% |
| 4 | 1.57 | 33% |
| 5 | 1.60 | 33% |
| 6 | 1.62 | 33% |
| 7 | 1.63 | 33% |
| 8 | 1.64 | 33% |

Tables III and IV show that the bit flip gains provided by convolutional codes are significantly higher than those provided by Repetition codes (as shown in Table II).

The numbers in Table III reflect the problem of lossy compression of equiprobable binary data using the rate 1/2 convolutional code with 2 states. For this case, it is possible to analyze the Viterbi algorithm via a Markov process on three decoder states and to show that on average it is only necessary to change one bit in six to convert a random binary vector to a codeword.

In particular, the cost of writing N data bits as a codeword of length 2N is then N/3, the cost of writing N uncoded bits is N/2, so the bit flip gain is 3/2. This is slightly different from the value reported in Table III because the input to the coset code is a random Hamming codeword and not a random vector.

Thus, very simple convolutional codes are remarkably effective as coset codes.

For the cases shown in Table III and Table IV, the Viterbi algorithm is used to select the coset representative. It can be seen that bit flip gains increase with constraint length and significant gains are possible with modest complexity (16 trellis states).

Note however that gains are considerably more modest when the decoding window for the convolutional code is shorter than the full codeword length. One advantage of using convolutional codes is that it is possible to optimize pattern matching by delaying decoding decisions.

Table V lists bit flips gains for convolutional codes using a sliding window from size 16 to the full codeword length. These gains are calculated by numerical simulation. The sliding window also refers to the history depth for the convolutional codes.

TABLE V

| | Bit Flip Gains | | |
| History Depth | 8-State Code | 512-State Code | Area Overhead |
|---|---|---|---|
| 16 | 1.55 | 1 | 100% |
| 32 | 1.80 | 1.11 | 100% |
| 64 | 1.84 | 1.37 | 100% |
| 128 | 1.84 | 1.78 | 100% |
| 256 | 1.84 | 2.05 | 100% |
| 512 | 1.84 | 2.1 | 100% |

Figure 9A:
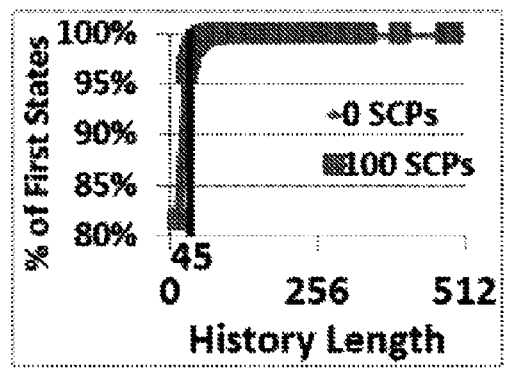
FIGS. 9A-9B show the effects of using a sliding window on lifetime gain for a rate 1/2 8-state code, codeword length 1024-bits, in accordance with an embodiment of the invention.
Figure 9B:
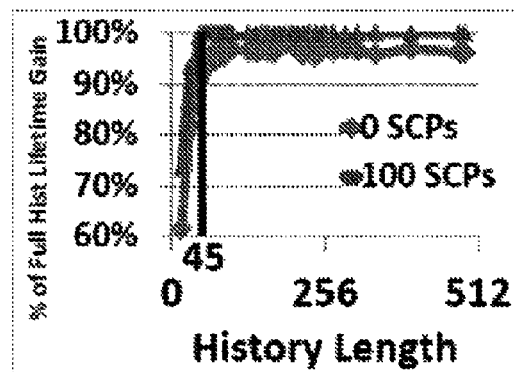

In the application of convolutional codes to digital communication, the input sequence is a codeword perturbed by noise rather than a random vector, so quantization is less of a challenge. Experience and analysis have shown that if the number of stages t in the decoder window is on the order of 5 times the constraint length then with probability approaching 1 all survivors stem from the same information block t stages back. When random vector inputs are used with the Viterbi algorithm as applied in embodiments of the invention, reduction to a single survivor is slower. FIGS. 9A and 9B show that convergence for a code of constraint length 3 occurs only after approximately 45 stages. FIG. 9A shows a first state convergence and FIG. 9B shows % of full lifetime gain when using a sliding window on lifetime gain for a rate 1/2 8-state code, codeword length 1024 bits in accordance with an embodiment of the invention.

Example

Saturated Cell Pointers

Saturated Cell Pointers (SCPs) can be incorporated in embodiments of the invention to provide replacement bits for writing to when a cell saturates. This increases the number of writes that can be performed before the page is erased.

SCPs are resources that can be combined with coset coding of embodiments of the invention to extend the lifetime of memory. A SCP points at a saturated cell and delays the need to erase the page by providing one or more replacement bits. When the page is erased the pointer is also erased.

Figure 10:
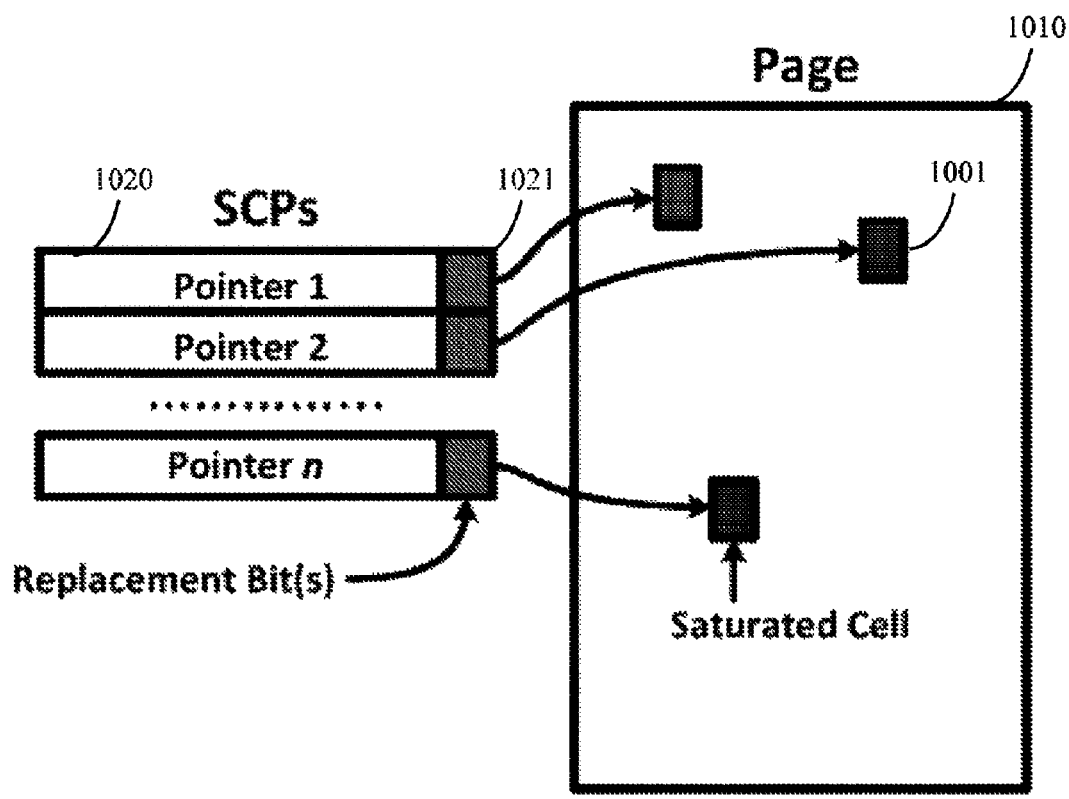
FIG. 10 shows a representation of writing with SCPs in accordance with an embodiment of the invention.

FIG. 10 shows a representation of writing with SCPs in accordance with an embodiment of the invention. Referring to FIG. 10, for each saturated cell 1001 in a page 1010, an SCP 1020 can provide one or more replacement bits 1021.

Table I shows lifetime gains for different numbers of SCPs when writing to a 4 kB page of SLC and MLC Flash. Area overhead is calculated for a rate 1/2, 512-state convolutional code.

TABLE I

| | # of Writes | | | |
| # of SCPs | SLC | 4-MLC | 8-MLC | Area Overhead |
|---|---|---|---|---|
| 0 | 3 | 15-16 | 45 | 0% |
| 1 | 3 | 16 | 45 | 0% |
| 10 | 3 | 16 | 46 | 0.5% |
| 20 | 3 | 16-17 | 46 | 1% |
| 50 | 4 | 17 | 47 | 2.4% |
| 100 | 4 | 18 | 48 | 4.9% |
| 200 | 4 | 18 | 49 | 10% |
| 500 | 4 | 19 | 49 | 24% |
| 1000 | 5 | 19 | 50 | 49% |

As the SCPs become active, the quantization problem approaches that of finding a convolutional codeword that matches the SCP entries. These entries constitute a fraction of the total entries and there is a threshold above which there are diminishing returns. That is, the number of SCPs used can be selected for optimal writing.

Example

Viterbi Algorithm

In accordance with embodiments of the invention, the following Viterbi Algorithm may be used to select the representative coset that is written to memory.

Let q−1 be the number of writes that a cell can accommodate. A Viterbi algorithm is used to find a codeword in a rate 1/n convolutional code that best approximates the initial coset representative. The branch metric that minimizes Hamming distortion is the Hamming distance between the input $c=(c_1, \ldots, c_n)$ and the edge label $d=(d_1, \ldots, d_n)$.

Example

Viterbi Trellis Encoding Maximizing Bit Flip Reduction

Figure 11A:
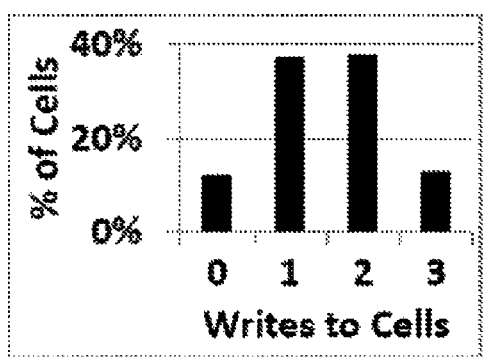
FIGS. 11A-11B show terminal page wear distribution across 4-level MLCs, comparing page wear distribution when no coding is used (FIG. 11A) and page wear distribution using a convolutional code with constraint length 9 in combination with 100 SCPs in accordance with an embodiment of the invention (FIG. 11B).
Figure 11B:
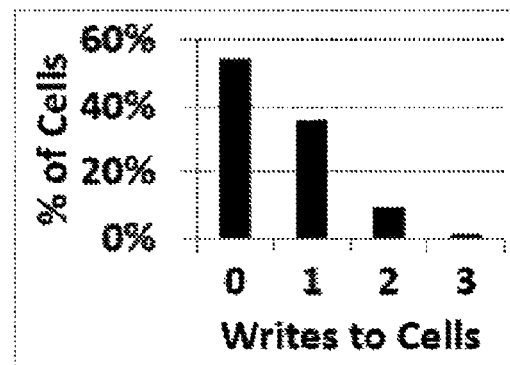

When the Viterbi algorithm selects the coset representative by minimizing the Hamming distortion without using weights (the weight vector for an edge), bit flip reduction can be accomplished. FIGS. 11A and 11B show terminal page wear distribution across 4-level MLCs immediately before an erase is required for uncoded recording (Case (a)—coding; FIG. 11A) and an implementation of coset coding without using weights in which convolution code with constraint length 9 was used in combination with 100 SCPs (Case (b)—coset coding, no wearleveling; FIG. 11B). As illustrated by these two cases, a small improvement can be gained between uncoded recording and coding without weights (from 3 writes before erase to 5 writes before erase).

Example

Viterbi Trellis Encoding Maximizing Number of Writes to a Page Before Erasure When uncoded data is written directly to Flash memory cells, uneven wear can significantly reduce the lifetime of the SSD. Wear can be reduced by reading the state of the memory and using this information to reduce the number of writes. This methodology is referred to as wearleveling and can be used in accordance with certain embodiments to improve wear when writing coded data to memory.

For example, a data word or its complement may be chosen in a manner similar to the Flip-n-write approach as described by S. Cho and H. Lee, "Flip-n-write: a simple deterministic technique to improve pram write performance, energy and endurance," in Proceedings of the $42^{nd}$ Annual IEEE/ACM International Symposium on Microarchitecture, ser. MICRO 42. New York, N.Y., USA: ACM, 2009, pp. 347-357.

To provide improved write efficiency, the edge metric in the Viterbi algorithm of Example—Viterbi Algorithm above can be modified to promote wearleveling.

Wearleveling is promoted by incorporating the Per Cell Previous Write Count (PCWC) into a new edge metric M(c, d) given by $$M(c,d) = \delta(c_1, d_1)W_1 + \ldots + \delta(c_n, d_n)W_n$$

where $\delta(x, y)$ is 0 when x and y are the same or 1 when x and y are different. If the number of prior writes to cell i, denoted here as e, is less than q−1 then the weight $W_i$ is set to the number of prior writes. If e=q−1 then the weight is set to a large positive number (e.g., to approximate infinity) to strongly discourage use of this edge. In PCWC, given w=# Writes Previously Done to a Cell, PCWC=w+1.

For example if the input is (1, 1), the edge label is (1, 0), and the PCWC vector is (2, 3), then the new edge weight is 3+1=4. When a cell is saturated and the input bit differs from the edge label, the corresponding edge metric is set to a large positive number to discourage use of that edge. The PCWC can be used as the cost function 642 described with respect to FIG. 6C.

The selection of the representative vector may involve a variety of functions of the PCWC. These functions of the PCWC may be supplemented in the case of convolutional codes by adding weights in the calculation of the edge metric of the Viterbi algorithm.

Figure 12A:
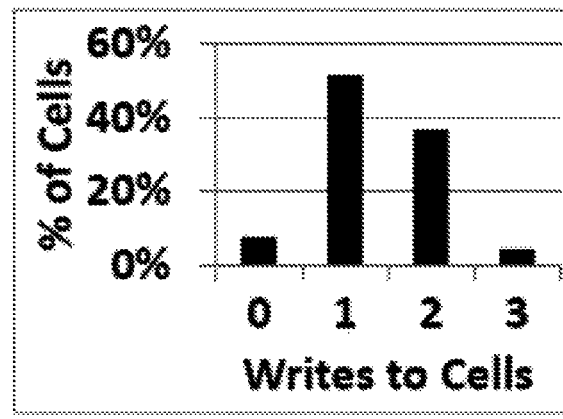
FIGS. 12A-12C show terminal page wear distribution across 4-level MLCs comparing page wear distribution for coset coding using a convolutional code with constraint length 9 in combination with 100 SCPs in accordance with an embodiment of the invention.
Figure 12B:
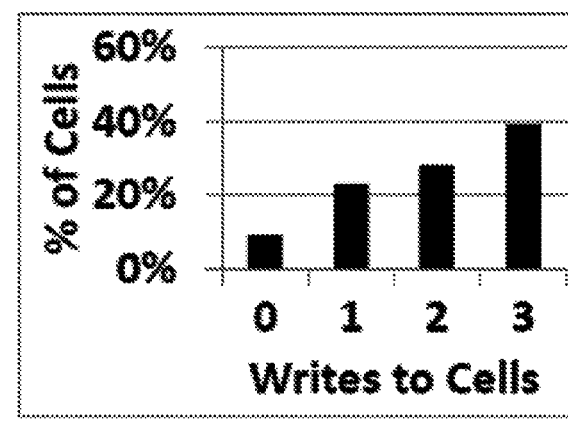
Figure 12C:
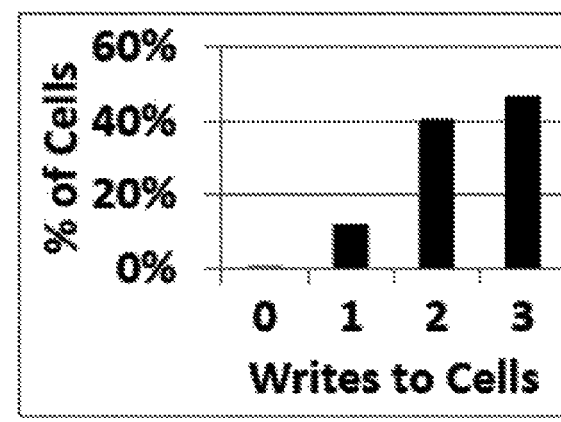

FIGS. 12A-12C show terminal page wear distribution across 4-level MLCs comparing page wear distribution for coset coding using a convolutional code with constraint length 9 in combination with 100 SCPs in accordance with an embodiment of the invention. FIG. 12A shows a first embodiment using the Viterbi edge metric incorporating PCPWC (11 writes before erase); FIG. 12B shows a second embodiment using the Viterbi edge metric forcing interpolation of saturated cell entries (16-17 writes before erase); and FIG. 12C shows the Viterbi edge metric combining the first and second embodiments (18 writes before erase).

As shown in FIG. 12A, incorporating PCPWC into the Viterbi edge metric creates a wear distribution very similar to that of uncoded recording/writing shown in FIG. 11A (but with more writes before erase). Requiring the coset representative to match values stored at saturated cell locations also creates a very favorable wear distribution as shown in FIG. 12B. In combination they provide a terminal wear distribution where about half the cells are fully saturated and almost every cell has been written to at least once as shown in FIG. 12C.

For example, the level of the cells can be determined when data is read from the memory during the encoding process. Therefore, it is possible to know which cells are saturated and which are not. When SCPs are incorporated, the values of the SCPs are read out along with the data and it is the values in the SCPs that are used to establish the levels. The SCP value overrides the data value if a SCP is being used in the PCPWC.

Figure 13B:
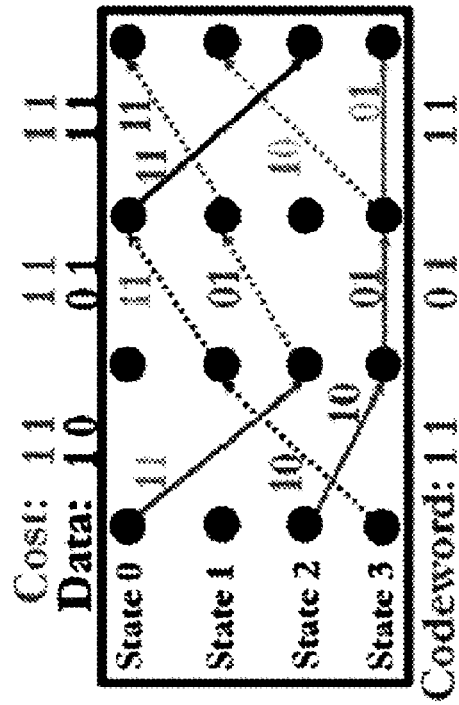
FIGS. 13A-13D provide graphical representations of the subject encoding methods at different stages in the life of a page according to an example embodiment
Figure 13A:
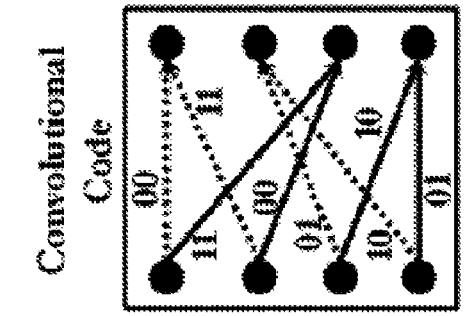
Figure 13D:
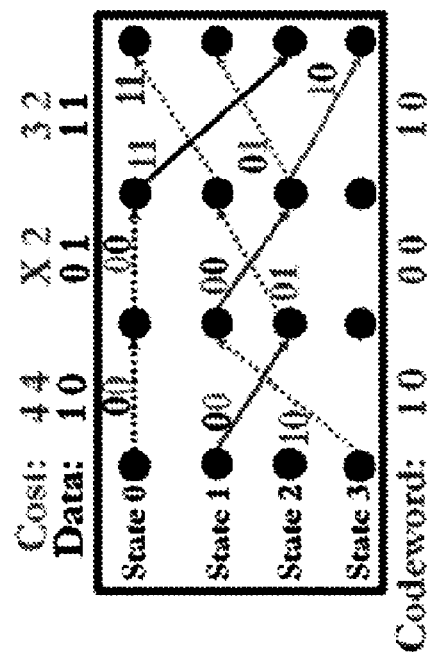
Figure 13C:
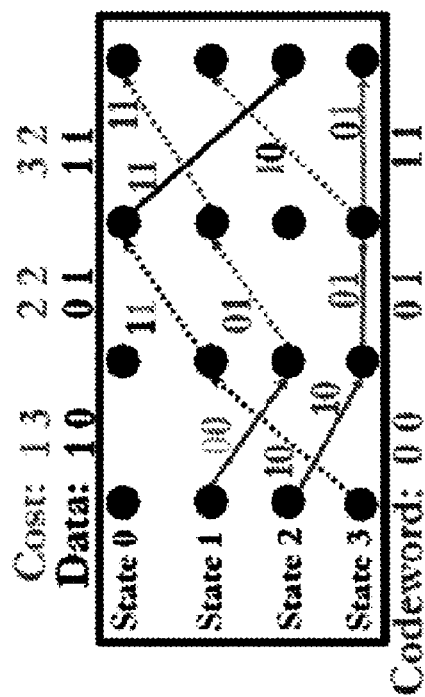

FIGS. 13A-13D provide examples of Viterbi path selection in three circumstances encountered during encoding. FIG. 13A shows the convolutional code used.

When there are no prior writes (FIG. 11B), the best path corresponds to the codeword that is closest in Hamming distance to the input string (e.g., the translate vector 624 of FIG. 6A or 6B). With prior writes (FIG. 11C), the number of the prior writes to a given cell is used as part of the calculations for the Viterbi edge metric. With saturated cells (FIG. 11D) the Viterbi edge metric is modified further to force survivor paths to match the entries in these cells. For example, if a cell is actually saturated and no SCP is being used, the cost function (see FIG. 6B) used during the Viterbi algorithm establishes a large value for the path having the saturated cell, reducing the likelihood that a vector will attempt to be written to a saturated cell.

Figure 14A:
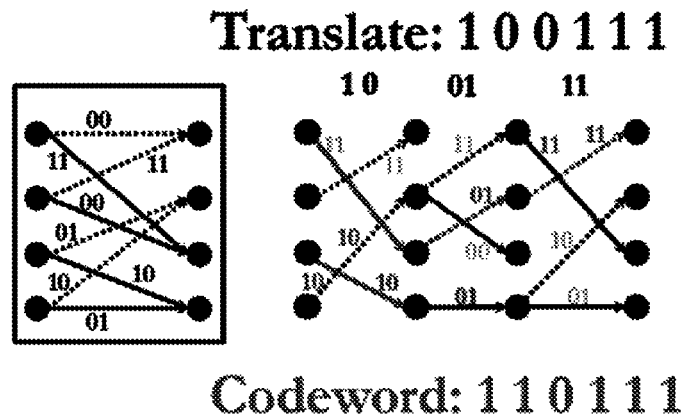
FIGS. 14A-14C provide graphical representations of an encoding method in accordance with an embodiment of the invention.
Figure 14B:
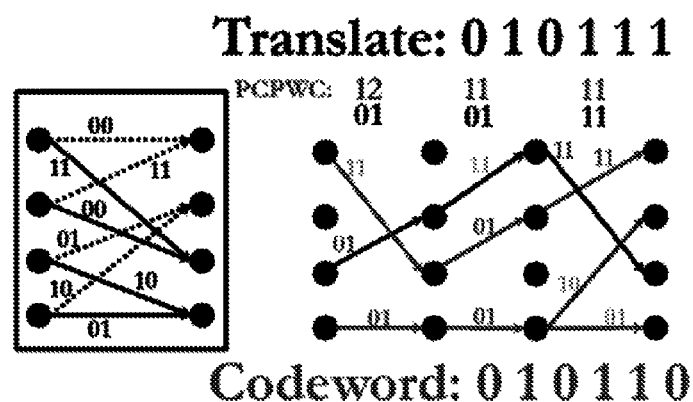
Figure 14C:
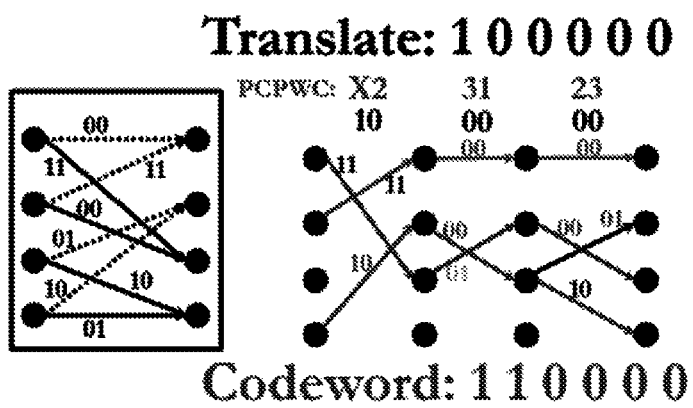

FIGS. 14A-14C illustrate the process in more detail. For example, if a first write to a page is to write 100111, then without using the coset coding of embodiments of the invention, writing 100111 directly to memory having original data of 000000 requires 4 bits to be flipped. However, using coset coding of an embodiment of the invention, given a translate of 100111, the coset codeword (using a convolutional coset code) is obtained as 110111 as shown in FIG. 14A, resulting in the following steps as described with respect to FIG. 6B.

|     | Translate (624): | 100111 |
| --- | --- | --- |
| XOR | Codeword (640): | 110111 |
| (630) | Error Vector: | 010000 |
| + | Old Data (612): | 000000 |
| (632) | New Data: | 010000 |

Accordingly, only 1 bit is written for the case of a first write to memory (such as after an erase). For a second write, given 010000 as the data stored in memory from the first write and new data as 000111, wearleveling is introduced by using the PCPWC such that given w=# Writes Previously Done to a Cell, PCPWC=w+1. That is, because the memory is read before writing, it is possible to indicate that the cell has been written to (and how many times).

For example, the translate vector can be created using the XOR operation of the ECC codeword 610 and the previously written data sub-block 612 (see FIG. 6A). Then, the coset codeword (using the convolutional coset code) is obtained as 010110 as shown in FIG. 14B, resulting in the following steps as described with respect to FIGS. 6A and 6B.

|     | Old Data (612): | 010000 |
| XOR | New Data (610): | 000111 |
|     | Translate (624): | 010111 |
| XOR | Codeword (640): | 010110 |
| (630) | Error Vector: | 000001 |
| + | Old Data (612): | 010000 |
| (632) | New Data: | 010001 |

Accordingly, wearleveling is accomplished and only one bit is written for this second write to memory. For an nth write to the memory before the page is erased, there can exist bits (cells) that are saturated and cannot be written to. For example, given old data of 312022, where there are only 4 levels to the Flash cell, the first bit cannot be written to because it is already at saturation (indicated by "3" for this example). Embodiments of the invention utilize the information regarding the number of levels in the Flash cells to find a vector that can be written to the memory, as shown in FIG. 14C. For example, with 4 levels available, the PCPWC indicates X allowed writes to the saturated bit. The following steps are carried out as described with respect to FIGS. 6A and 6B.

|     | Old Data (612): | 312022 |
| XOR | New Data (610): | 010000 |
|     | Translate (624): | 100000 |
| XOR | Codeword (640): | 110000 |
| (630) | Error Vector: | 010000 |
| + | Old Data (612): | 312012 |
| (632) | New Data: | 322012 |

As illustrated by the above example, it can be seen that even when one of the cells is saturated, it can be possible to find a vector to write to memory.

Example

Lifetime Extension Comparison

To illustrate the advantageous effects of certain embodiments of the invention, an implementation of coset coding using a convolutional code with constraint length 9 in combination with 100 SCPs is presented and compared to other methodologies based on:

(A) Jiang et al. "Floating codes for joint information storage in write asymmetric memories," in IEEE International Symposium on Information Theory, 2007. IEEE, June 2007, pp. 1166-1170; and (B) Jagmohan et al. "Write amplification reduction in NAND flash through multi-write coding," in 2010 IEEE 26$^{th}$ Symposium on Mass Storage Systems and Technologies (MSST), IEEE, May 2010, pp. 1-6.

Floating codes are presented in (A). The codewords in a Floating Code are organized in a multilevel directed graph where updating a single input variable $d_i$ causes the memory state to change from one level to the next. The number of levels in the graph is more than the number of states in an individual cell, and this translates to extending the life of the memory. For example, given a 3-state MLC, it is possible with 3 cells to guarantee that 2 data bits can be rewritten 5 times. With no coding, data is written directly to memory (k=n) and only 3 rewrites are possible if the same bit is updated three times. In this example, the price of resilience to updates that are focused on a single input bit is 50% area overhead.

Enumerative coding is a generalized technique for mapping between a set of vectors and their relative indexes when lexographically enumerated. For example, (B) uses enumerative coding to guarantee two writes to SLC cells before erasing is required. Jagmohan et al. (B) does this by representing the input data as a lexographic index of a set of vectors V. The vectors in V all have the same symbol frequency distribution. Vectors are then selected from V to be written to memory. A second write is accomplished by indexing the feasible vectors that remain, and the rate of the second write depends on what was initially written. Decoding consists of determining the lexographic order of the written vector, which is then read out as the data.

For the subject implementation, random inputs of length 501 choose the initial coset representative, which is a codeword in an extended Hamming code of length 1024. The Viterbi algorithm then chooses the coset representative that is written to a 4 kB page.

Since enumerative codes have a pre-determined number of rewrites, the numbers from their Jagmohan et al.'s prior papers were used for comparison of their lifetime improvements.

To evaluate the Floating codes, the mapping of 2 logical bits to 4 physical cells presented in (A) is used. Random data, viewed as a sequence of pairs of logical bits, is written to a 4 kB page and each time a pair is rewritten a counter specific to that pair is decremented. Erasure is required when the counter associated with some pair of bits reaches zero. Floating codes were implemented in combination with 100 SCPs for fair comparison with coset coding. This actually favors Floating code over coset coding since each Floating code SCP contained two replacement bits instead of one.

Table VI compares the effect of different coding techniques on the number of writes to a 4 kB page (100% overhead; random inputs) before erasure is required.

TABLE VI

| Coding Technique | | Number of Writes Before Erasure is Required | | | | | |
|---|---|---|---|---|---|---|---|
| Scheme | Encoding Granularity | SLC | 4-level MLC | 8-level MLC | 16-level MLC | 200-level MLC | ECC |
| Coset Coding + ECC + 100 SCPs | 501-bits | 4 | 18 | 48 | 112 | 1632 | Yes |
| Floating Codes + 100 SCPs (A) | 2-bits | 1 | 6 | 17 | 41 | 651 | N/A |
| Enumerative Coding (B) | 3-bits | 2 | N/A | N/A | N/A | N/A | N/A |

Table VII compares the data to a baseline incorporating waterfall coding (mod 2). Here, binary data is written to memory using waterfall coding as described by Lastras-Montano et al. ("On the lifetime of multilevel memories," in Proceedings of the 2009 IEEE International conference on Symposium on Information Theory—Volume 2, ser. ISIT'09. Piscataway, N.J., USA, 2009, p. 1224-1228) in which the MLC value is interpreted modulo 2 (for example a physical value of 7 is read as a logical 1).

The coset code results were obtained with 100 SCPs by applying the Viterbi edge metrics described in EXAMPLE:—Viterbi trellis encoding maximizing number of writes to a page before erasure—to a convolutional code with constraint length 9.

TABLE VII

| Coding Technique | | Expected Lifetime Gain | | | | | |
|---|---|---|---|---|---|---|---|
| Scheme | Encoding Granularity | SLC | 4-level MLC | 8-level MLC | 16-level MLC | 200-level MLC | ECC |
| Coset Coding + ECC + 100 SCPs | 501-bits | 300% | 500% | 586% | 640% | 720% | Yes |
| Floating Codes + 100 SCPs (A) | 2-bits | 0% | 100% | 143% | 173% | 227% | N/A |
| Enumerative Coding (B) | 3-bits | 100% | N/A | N/A | N/A | N/A | N/A |

As shown in Tables VI and VII, the lifetime gains associated with coset coding are superior to those associated with other techniques by a factor between 3 and 8. Coset coding gains increase with the number of levels in the cells. To approximate coset coding gains in the infinite case, coset coding was simulated using 200-level cells, resulting in a lifetime gain of 720%. This shows how a significant lifetime benefit can still be obtained using more than 16-level MLCs.

Tables VI and VII report results for random writes leaving open the possibility that a worst case pattern of writes might compromise the expected lifetime extension.

Instead of the injective mapping from input bits to recorded bits as performed by Floating codes, coset codes used in embodiments of the invention have the property that there are many ways to represent every pattern of inputs, and that the different ways are distributed across the entire page. Accordingly, embodiments of the invention indicate that there is little or no difference between worst case and average case lifetime extension.

One of the advantages of the coset coding approach of embodiments of the invention is that information carried by an individual input bit is spread across a larger number of memory cells (such as compared to Floating codes). The granularity of encoding with coset codes is larger than that of floating codes (on the order of 1024-bits versus 2-bits). Therefore, coset codes can be used to spread the wear out over more cells as compared to floating codes even if the same data bits are written. It can be considered in many cases immaterial whether updates are focused on a small number of bits or distributed more evenly because of certain embodiments performing an initial mapping to an ECC codeword, which flips a different number of bits compared to the input dataword, and then using Viterbi for wearleveling.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A method of managing memory, the method comprising:
   receiving a write address and write data to be written to a memory location corresponding to the write address;
   reading a current memory state of the memory location corresponding to the write address; and
   selecting a codeword for the write data to write to memory according to a metric minimizing overwrite to the memory location corresponding to the write address and maximizing spread of wear across memory cells of the memory location, wherein selecting the codeword for the write data to write to memory according to the metric minimizing overwrite to the memory location corresponding to the write address and maximizing spread of wear across memory cells of the memory location comprises:

performing an error correction code (ECC) encoding of the write data to map the write data to an ECC codeword;

creating a translate vector using the ECC codeword and data read from the memory location during reading of the current memory state;

performing a matching process of the translate vector using a coset sub-code to provide a coset codeword; and performing a Boolean operation using the translate vector and the coset codeword as inputs to output an error vector providing the codeword for the write data, wherein performing the matching process of the translate vector using the coset sub-code to provide the coset codeword comprises:

searching the coset sub-code for a representative vector having minimum Hamming weight to the translate vector.

2. The method of claim 1, wherein the memory location comprises Flash cells.

3. The method of claim 1, wherein the memory location comprises phase change memory.

4. The method of claim 1, wherein reading the current memory state of the memory location corresponding to the write address comprises reading a page of memory and performing an error correction code (ECC) correction to values read from the page.

5. The method of claim 1, wherein the memory location comprises multi-level cells, the method further comprising applying waterfall coding of mod 2 to data read from the memory location during reading of the current memory state.

6. The method of claim 1, wherein the Boolean operation is XOR.

7. The method of claim 1, wherein the ECC comprises a linear code.

8. The method of claim 7, wherein the ECC comprises a block code.

9. The method of claim 7, wherein the ECC comprises a convolutional code.

10. The method of claim 1, wherein creating the translate vector comprises performing an XOR operation using the ECC codeword and the data read from the memory location during reading of the current memory state.

11. The method of claim 1, wherein the coset sub-code comprises a repetition code, a block code, or a convolutional code.

12. The method of claim 1, further comprising using a per cell previous write count to select the representative vector maximizing the spread of wear across the memory cells of the memory location.

13. The method of claim 1, further comprising:
receiving a read request;
accessing the codeword written to the memory location; and decoding the codeword.

14. A method of managing memory, the method comprising:

receiving a write address and write data to be written to a memory location corresponding to the write address;
reading a current memory state of the memory location corresponding to the write address; and selecting a codeword for the write data to write to memory according to a metric minimizing overwrite to the memory location corresponding to the write address and maximizing spread of wear across memory cells of the memory location, wherein selecting the codeword for the write data to write to memory according to the metric minimizing overwrite to the memory location corresponding to the write address and maximizing spread of wear across memory cells of the memory location comprises:

performing an error correction code (ECC) encoding of the write data to map the write data to an ECC codeword;

creating a translate vector using the ECC codeword and data read from the memory location during reading of the current memory state;

performing a matching process of the translate vector using a coset sub-code to provide a coset codeword; and performing a Boolean operation using the translate vector and the coset codeword as inputs to output an error vector providing the codeword for the write data, wherein performing the matching process of the translate vector using the coset sub-code to provide the coset codeword comprises:

generating a cost function for wearleveling from data read from the memory location during reading of the current memory state;

determining a number of levels available in multi-level cells of the memory location; and performing a Viterbi Algorithm to select a representative vector from the coset sub-code using the cost function and the number of levels available as an edge metric.

15. The method of claim 14, wherein the cost function comprises a per cell previous write count.

16. The method of claim 14, wherein determining the number of levels available in multi-level cells of the memory location comprises determining whether a cell is saturated when reading the current memory state of the memory location.

17. The method of claim 16, further comprising reading a value of a saturated cell pointer when reading the current memory state of the memory location.

18. The method of claim 17, wherein the value of the saturated cell pointer establishes an entry of the representative vector selected by the Viterbi Algorithm.

19. The method of claim 14, wherein the memory location comprises Flash cells.

20. The method of claim 14, wherein the memory location comprises phase change memory.

21. The method of claim 14, wherein reading the current memory state of the memory location corresponding to the write address comprises reading a page of memory and performing an error correction code (ECC) correction to values read from the page.

22. The method of claim 14, wherein the memory location comprises multi-level cells, the method further comprising applying waterfall coding of mod 2 to data read from the memory location during reading of the current memory state.

23. The method of claim 14, wherein the Boolean operation is XOR.

24. The method of claim 14, wherein the ECC comprises a linear code.

25. The method of claim 24, wherein the ECC comprises a block code.

26. The method of claim 24, wherein the ECC comprises a convolutional code.

27. The method of claim 14, wherein creating the translate vector comprises performing an XOR operation using the ECC codeword and the data read from the memory location during reading of the current memory state.

28. The method of claim 14, wherein the coset sub-code comprises a repetition code, a block code, or a convolutional code.

29. The method of claim 14, further comprising:
receiving a read request;
accessing the codeword written to the memory location; and decoding the codeword.

30. A solid state device (SSD) memory storage system comprising:
a host interface for communicating to a host device;
a Flash memory for storing data; and
a SSD controller configured to:
receive a write address and write data to be written to a memory location corresponding to the write address;
read a current memory state of the memory location corresponding to the write address; and
select a codeword for the write data to write to memory according to a metric minimizing overwrite to the memory location corresponding to the write address and maximizing spread of wear across memory cells of the memory location,
wherein selecting the codeword for the write data to write to memory according to the metric minimizing overwrite to the memory location corresponding to the write address and maximizing spread of wear across memory cells of the memory location comprises:
performing an error correction code (ECC) encoding of the write data to map the write data to an ECC codeword;
creating a translate vector using the ECC codeword and data read from the memory location during reading of the current memory state;
performing a matching process of the translate vector using a coset sub-code to provide a coset codeword; and
performing a Boolean operation using the translate vector and the coset codeword as inputs to output an error vector providing the codeword for the write data,
wherein performing the matching process of the translate vector using the coset sub-code to provide the coset codeword comprises:
searching the coset sub-code for a representative vector having minimum Hamming weight to the translate vector.

31. An apparatus comprising:
a memory; and
a memory manager, the memory manager configured to:
receive a write address and write data to be written to a memory location of the memory corresponding to the write address;
read a current memory state of the memory location corresponding to the write address; and
select a codeword for the write data to write to memory according to a metric minimizing overwrite to the memory location corresponding to the write address and maximizing spread of wear across memory cells of the memory location,
wherein selecting the codeword for the write data to write to memory according to the metric minimizing overwrite to the memory location corresponding to the write address and maximizing spread of wear across memory cells of the memory location comprises:
performing an error correction code (ECC) encoding of the write data to map the write data to an ECC codeword;
creating a translate vector using the ECC codeword and data read from the memory location during reading of the current memory state;
performing a matching process of the translate vector using a coset sub-code to provide a coset codeword; and
performing a Boolean operation using the translate vector and the coset codeword as inputs to output an error vector providing the codeword for the write data,
wherein performing the matching process of the translate vector using the coset sub-code to provide the coset codeword comprises:
searching the coset sub-code for a representative vector having minimum Hamming weight to the translate vector.

32. A solid state device (SSD) memory storage system comprising:
a host interface for communicating to a host device;
a Flash memory for storing data; and
a SSD controller configured to:
receive a write address and write data to be written to a memory location corresponding to the write address;
read a current memory state of the memory location corresponding to the write address; and
select a codeword for the write data to write to memory according to a metric minimizing overwrite to the memory location corresponding to the write address and maximizing spread of wear across memory cells of the memory location,
wherein selecting the codeword for the write data to write to memory according to the metric minimizing overwrite to the memory location corresponding to the write address and maximizing spread of wear across memory cells of the memory location comprises:
performing an error correction code (ECC) encoding of the write data to map the write data to an ECC codeword;
creating a translate vector using the ECC codeword and data read from the memory location during reading of the current memory state;
performing a matching process of the translate vector using a coset sub-code to provide a coset codeword; and
performing a Boolean operation using the translate vector and the coset codeword as inputs to output an error vector providing the codeword for the write data,
wherein performing the matching process of the translate vector using the coset sub-code to provide the coset codeword comprises:
generating a cost function for wearleveling from data read from the memory location during reading of the current memory state;
determining a number of levels available in multi-level cells of the memory location; and
performing a Viterbi Algorithm to select a representative vector from the coset sub-code using the cost function and the number of levels available as an edge metric.

33. An apparatus comprising:
a memory; and
a memory manager, the memory manager configured to:
- receive a write address and write data to be written to a memory location of the memory corresponding to the write address;
- read a current memory state of the memory location corresponding to the write address; and
- select a codeword for the write data to write to memory according to a metric minimizing overwrite to the memory location corresponding to the write address and maximizing spread of wear across memory cells of the memory location, wherein selecting the codeword for the write data to write to memory according to the metric minimizing overwrite to the memory location corresponding to the write address and maximizing spread of wear across memory cells of the memory location comprises:
performing an error correction code (ECC) encoding of the write data to map the write data to an ECC codeword;
creating a translate vector using the ECC codeword and data read from the memory location during reading of the current memory state;
performing a matching process of the translate vector using a coset sub-code to provide a coset codeword; and
performing a Boolean operation using the translate vector and the coset codeword as inputs to output an error vector providing the codeword for the write data,
wherein performing the matching process of the translate vector using the coset sub-code to provide the coset codeword comprises:
generating a cost function for wearleveling from data read from the memory location during reading of the current memory state;
determining a number of levels available in multi-level cells of the memory location; and
performing a Viterbi Algorithm to select a representative vector from the coset sub-code using the cost function and the number of levels available as an edge metric.

* * * * *